US012293469B2

(12) United States Patent
Fox et al.

(10) Patent No.: US 12,293,469 B2
(45) Date of Patent: May 6, 2025

(54) VIRTUAL REALITY DESIGN NAVIGATION USING A TEMPORAL COLLABORATION DEPENDENCY MAP

(71) Applicant: International Business Machines Corporation, Armonk, NY (US)

(72) Inventors: Jeremy R. Fox, Georgetown, TX (US); Martin G. Keen, Cary, NC (US); Alexander Reznicek, Troy, NY (US); Bahman Hekmatshoartabari, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 183 days.

(21) Appl. No.: 18/055,911

(22) Filed: Nov. 16, 2022

(65) Prior Publication Data
US 2024/0161408 A1 May 16, 2024

(51) Int. Cl.
*G06T 19/00* (2011.01)
(52) U.S. Cl.
CPC .................... *G06T 19/00* (2013.01)
(58) Field of Classification Search
None
See application file for complete search history.

(56) References Cited

U.S. PATENT DOCUMENTS

| | | | |
|---|---|---|---|
| 7,330,822 B1 * | 2/2008 | Robson | G06Q 10/063118 705/7.17 |
| 9,588,970 B2 | 3/2017 | Rinearson et al. | |
| 9,715,563 B1 | 7/2017 | Schroeder | |
| 2010/0042676 A1 * | 2/2010 | Seroussi | G06F 30/13 703/1 |
| 2010/0313145 A1 | 12/2010 | Dillenberger et al. | |
| 2012/0030289 A1 | 2/2012 | Buford et al. | |
| 2012/0123764 A1 * | 5/2012 | Ito | G06F 9/5055 703/21 |
| 2012/0316841 A1 * | 12/2012 | Rameau | G06T 17/005 703/1 |
| 2013/0144566 A1 | 6/2013 | De Biswas | |

(Continued)

FOREIGN PATENT DOCUMENTS

| | | |
|---|---|---|
| CN | 207992940 U | 10/2018 |
| KR | 102336069 B1 | 12/2021 |

OTHER PUBLICATIONS

Agustina, and Chengzheng Sun. "Dependency-conflict detection in real-time collaborative 3D design systems." Proceedings of the 2013 conference on Computer supported cooperative work. 2013.*

(Continued)

*Primary Examiner* — Sultana M Zalalee
(74) *Attorney, Agent, or Firm* — CANTOR COLBURN LLP; Kelsey M. Skodje

(57) ABSTRACT

Embodiments of the invention are directed to a computer-implemented method that includes accessing, using a processor system, a three-dimensional (3D) model of a device-under-design (DUD). The processor system is used to receive a first design operation associated with the 3D model of the DUD. A collaboration dependency model is used to make a prediction of a dependency relationship between the first design operation and a second design operation.

20 Claims, 13 Drawing Sheets

(56) References Cited

U.S. PATENT DOCUMENTS

| | | | |
|---|---|---|---|
| 2015/0120252 A1* | 4/2015 | Hepworth | G06F 30/30 |
| | | | 703/1 |
| 2015/0242561 A1* | 8/2015 | Sharma | G06F 30/3312 |
| | | | 716/52 |
| 2016/0246899 A1* | 8/2016 | Hirschtick | G06F 30/00 |
| 2017/0185592 A1* | 6/2017 | Frei | H04N 21/84 |
| 2018/0096507 A1 | 4/2018 | Valdivia et al. | |
| 2019/0266565 A1* | 8/2019 | Tanoue | G05B 19/418 |
| 2020/0342549 A1* | 10/2020 | Thouzeau | G06Q 50/04 |
| 2021/0090343 A1* | 3/2021 | Godi | G06F 3/011 |
| 2021/0287177 A1* | 9/2021 | Musialek | G06Q 10/06312 |
| 2021/0334442 A1 | 10/2021 | Zhu et al. | |
| 2022/0236697 A1* | 7/2022 | Stump | G06F 8/71 |
| 2023/0085697 A1* | 3/2023 | Bulu | G16H 10/60 |
| | | | 705/3 |
| 2024/0314197 A1* | 9/2024 | Qu | G06N 3/0895 |

OTHER PUBLICATIONS

"Four-Dimensional Space." Wikipedia. https://en.wikipedia.org/wiki/Four-dimensional_space (retrieved Nov. 15, 2022). 10 pages.

Blyler. "Virtual Reality for Chip Design?" ChipEstimate.com Semiconductor IP News and Trends Blog. https://www.chipestimate.com/Virtual-Reality-for-Chip-Design/blogs/1099 (retrieved Jul. 21, 2022). Oct. 2012. 2 pages.

Van Nederveen. "Collaborative design in second life." Second International Conference World of Construction Project Management. Delft University of Technology, 2007. 7 pages.

* cited by examiner

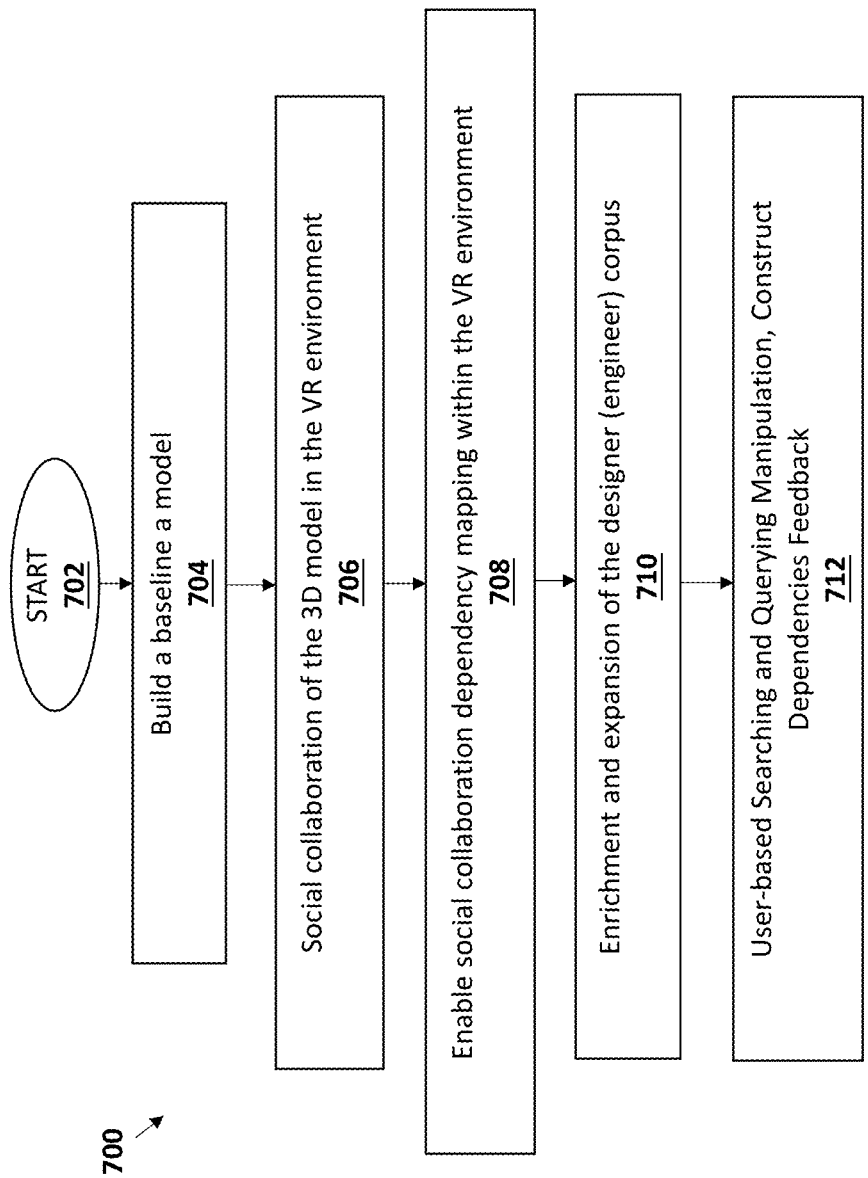

VIRTUAL REALITY DESIGN NAVIGATION USING A TEMPORAL COLLABORATION DEPENDENCY MAP

BACKGROUND

The present invention relates in general to programmable computer systems operable to implement virtual reality (VR) environments. More specifically, the present invention relates to computing systems, computer-implemented methods, and computer program products operable to navigate device design operations in a VR environment using a novel temporal collaboration dependency map.

Computer-aided design (CAD) is the use of computer-based software to aid in design processes. CAD software is frequently used by different types of engineers and designers. CAD software can be used to create two-dimensional (2-D) drawings or three-dimensional (3-D) models of a device-under-design (DUD). The purpose of CAD is to optimize and streamline the designer's workflow, increase productivity, improve the quality and level of detail in the design, improve documentation communications, and often contribute toward a manufacturing design database. CAD software outputs come in the form of electronic files, which are then used accordingly for manufacturing and/or fabrication processes. CAD is often used in tandem with digitized manufacturing/fabrication processes. Computer-aided design/computer-aided manufacturing (CAD/CAM) is software used to design products such as electronic circuit boards in computers and other devices.

360-degree videos, also known as immersive videos or spherical videos, are video recordings where a view in every direction is recorded at the same time using, for example, an omnidirectional camera or a collection of cameras. An immersive 360-degree video system can be implemented as a computer system operable to generate and display immersive 360-degree video images that simulate a real world experience. A person can enter and leave the simulated real world experience at any time using technology. The basic components of a 360-degree video system include a display; a computing system; and various feedback components that provide inputs from the user to the computing system.

SUMMARY

Embodiments of the invention are directed to a computer-implemented method that includes accessing, using a processor system, a three-dimensional (3D) model of a device-under-design (DUD). The processor system receives a first design operation associated with the 3D model of the DUD. A collaboration dependency model is used to make a prediction of a dependency relationship between the first design operation and a second design operation.

Embodiments of the invention are also directed to computer systems and computer program products having substantially the same features as the computer-implemented method described above.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIG. 7 depicts a flow diagram illustrating a computer-implemented methodology according to embodiments of the invention;

Figure 1:
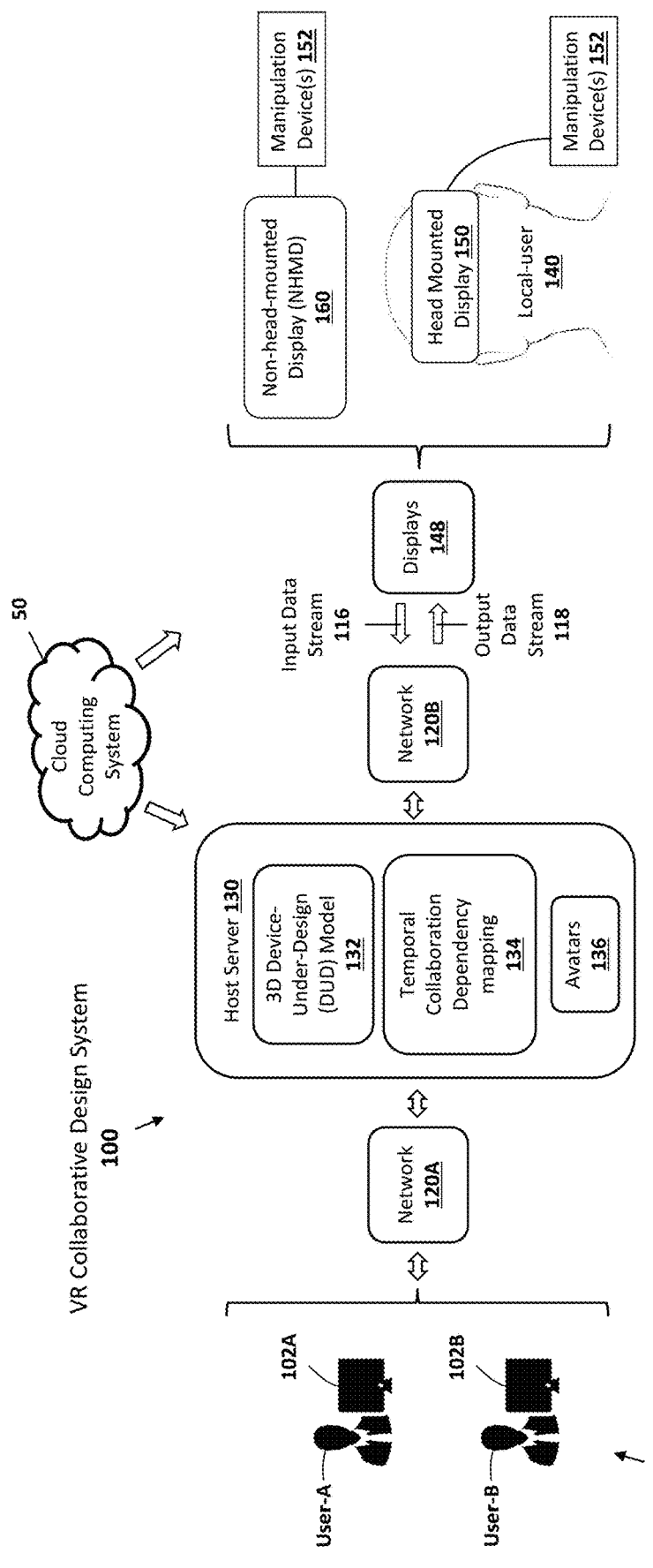
FIG. 1 depicts a block diagram illustrating a system according to embodiments of the invention.

In the accompanying figures and following detailed description of the disclosed embodiments, the various elements illustrated in the figures are provided with three digit reference numbers. In some instances, the leftmost digits of each reference number corresponds to the figure in which its element is first illustrated.

DETAILED DESCRIPTION

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Many of the functional units of the systems described in this specification have been labeled as modules. Embodiments of the invention apply to a wide variety of module implementations. For example, a module can be implemented as a hardware circuit including custom VLSI circuits or gate arrays, off-the-shelf semiconductors such as logic chips, transistors, or other discrete components. A module can also be implemented in programmable hardware devices such as field programmable gate arrays, programmable array logic, programmable logic devices or the like. Modules can also be implemented in software for execution by various types of processors. An identified module of executable code can, for instance, include one or more physical or logical blocks of computer instructions which can, for instance, be organized as an object, procedure, or function. Nevertheless, the executables of an identified module need not be physically located together, but can include disparate instructions stored in different locations which, when joined logically together, function as the module and achieve the stated purpose for the module.

Many of the functional units of the systems described in this specification have been labeled as models. Embodiments of the invention apply to a wide variety of model implementations. For example, the models described herein can be implemented as machine learning algorithms and natural language processing algorithms configured and arranged to uncover unknown relationships between data/information and generate a model that applies the uncovered relationship to new data/information in order to perform an assigned task of the model. In aspects of the invention, the models described herein can have all of the features and functionality of the models depicted in FIGS. 8A and 8B, which are described in greater detail subsequently herein.

Turning now to an overview of technologies that are relevant to and/or support aspects of the invention, as previously noted herein, 360-degree videos, also known as immersive videos or spherical videos, are video recordings where a view in every direction is recorded at the same time using, for example, an omnidirectional camera or a collection of cameras. An immersive 360-degree video system can be implemented as a computer system operable to generate and display immersive 360-degree video images that simulate a real world experience. A person can enter and leave the simulated real world experience at any time using technology. The basic components of a 360-degree video system include a display; a computing system; and various feedback components that provide inputs from the user to the computing system. In some implementations, the display can be integrated within a head-mounted device (HMD) worn by the user and configured to deliver sensory impressions to the human senses (sight, sound, touch, smell, and the like) that mimic the sensory impressions that would be delivered to the human senses by the corresponding actual environment being displayed through the video. The type and the quality of these sensory impressions determine the level of immersion and the feeling of presence in the 360-degree video system. Other outputs provided by the HMD can include audio output and/or haptic feedback. The user can further interact with the HMD by providing inputs for processing by one or more components of the HMD. For example, the user can provide tactile inputs, voice commands, and other inputs while the HMD is mounted to the user's head.

The term "metaverse" describes a variety of VR environments, including highly immersive internet-based 3-D or virtually integrated environments. A metaverse environment can also be described as an online "place" where physical, virtual and augmented realities are shared. In an example implementation, activities of teams that need to collaborate to perform a task can, in theory, be performed by remotely-located collaborators meeting and performing computer-aided-design (CAD) activities in a metaverse environment. In general, CAD software is operable to design a 3D physical object (e.g., 3D non-planar transistor) by designing a 3D electronic model of the 3D physical object based on the various characteristics (materials, sizes, electrical properties, operations, etc.) of the 3D physical object that is being designed. A metaverse collaboration environment could, if practically implemented as a replacement for a corresponding physical environment, save on power, space utilization, rent, and the ability to retain employees. VR headsets could further enhance the experience of a metaverse collaboration environment by incorporating 3D graphics (e.g., augmented reality), customizable dashboards, and other elements. The collaborators would not need to be in the same room if they are in the same "virtual space," thus enabling them to collaborate even more effectively. The ability to virtually "travel" to various "places" in the metaverse could enable an operator to virtually visit any number of remote physical locations and interface efficiently with the systems at the remote physical locations.

Despite the potential benefits of performing collaboration activities in a VR (or metaverse) environment, there are challenges to realizing the above-described benefits of using VR/metaverse environments to perform design-based collaborations. For example, where the 3D physical object being designed is a non-planar transistor, the operations required to design non-planar transistors for functionality, ease of fabrication, and ease of integration with the non-planar transistor's associated integrated circuit (IC) are numerous and complex. As the complexity of non-planar devices increases, the complexity of the associated design operations also increases. Even for experienced designers, and even with the aid of CAD/CAM (computer-aided design/computer-aided manufacturing) software and related simulation tools, it is difficult for designers to envision the 3D model in all of its particular details, including, for example, the requirements for integrating a given non-planar device (e.g., a non-planar transistor) into an overall IC. The development of IC integration processes requires multiple modules (e.g., shallow trench isolation (STI), sheet formation, source/drain (S/D) regions, gate stacks, contacts, interconnect wiring, and the like). Each such module is complex in itself, and each module interacts with and/or affects downstream and/or upstream design operations (e.g., temperature limitations for epitaxial growth or gate stack reliability). Currently, there are no tools to assist a designer/collaborator who desires to implement design operation A at time-zero (T-0) with determining the downstream, subsequent design operations that are impacted by deigns operation A. Similarly, there are currently no tools to assist a designer/collaborator who desires to implement design operation D at time T-10 with determining the upstream, prior design operations that are impacted by deign operation D.

Turning now to an overview of aspects of the invention, embodiments of the invention provide programmable computer systems operable to enable a plurality of designers/collaborators to perform collaborative CAD/CAM design operations in a VR environment. More specifically, embodiments of the invention provide computing systems, computer-implemented methods, and computer program products operable to enable a plurality of designers/collaborators to perform collaborative CAD/CAM design operations in a VR/metaverse environment using a novel temporal collaboration dependency mapping operation. In embodiments of the invention, the temporal collaboration dependency mapping operation is generated by training a machine learning algorithm to create a collaboration dependency model operable to predict upstream and/or downstream (i.e., temporal) dependency relationships between the various design operations applied to a 3D model of a 3D physical object that is being designed from the ground up and/or a 3D model of a 3D physical object that is being updated and/or modified. In some embodiments of the invention, feedback is gathered from designers related to positive and negative outcomes of design operations (or design changes) applied to the 3D model at various design stages or steps over time. Additionally, in some embodiments of the invention, a historical corpus of designer feedback is gathered and stored from designers related to positive and negative outcomes of other instances of design operations (or design changes) applied to 3D models of the same or similar 3D physical objects.

The machine learning algorithm uses training data that includes the above-described designer feedback to train the temporal collaboration dependency model to perform the task of predicting the upstream and/or downstream dependent design operations of an applied design operation. In embodiments of the invention, an applied design operation is a design operation applied (e.g., using CAD/CAM functionality) by one or more designers to the 3D model at time-zero (T-0), and the dependent design operations are the one or more design operations that are impacted by the applied design operation. For example, where the 3D physical object is a non-planar transistor, an applied design operation can be setting the shallow trench isolation (STI) region depth to depth-A; and the dependent design operations can include design parameters such as the desired gate height of the non-planar transistor, along with the design parameters such as desired thickness of the gate oxide. In some embodiments of the invention, in addition to identifying the existence of the dependent design operations, the temporal collaboration dependency model can further include natural language processing (NLP) functionality that provides explanations and/or recommendations related to the applied and dependent design operations. Continuing with the above-described example where the applied design operation is setting the STI depth at depth-A, the explanation/recommendation can include an explanation of how an STI at depth-A impacts device characteristics associated with device features such as gate height and/or gate oxide thickness, as well as recommendations for how desired device characteristics associated with device features such as gate height and/or gate oxide thickness can be achieved given that STI is at depth-A.

In embodiments of the invention, the recommendations/explanations can be implemented using a computer-based Q&A module operable to generate an answer to natural language questions that are either pre-set or presented by one or more of the designers. As a non-limiting example, the Q&A module can include all of the features and functionality of a DeepQA technology developed by IBM®. DeepQA is a Q&A system that can conduct an interrogation on any subject (e.g., the impact of an applied design operations on associated dependent design operations) by applying elements of natural language processing, machine learning, information retrieval, hypothesis generation, hypothesis scoring, final ranking, and answer merging to arrive at a conclusion. Q&A systems such as IBM's DeepQA technology often use unstructured information management architecture (UIMA), which is a component software architecture for the development, discovery, composition, and deployment of multi-modal analytics for the analysis of unstructured information and its integration with search technologies developed by IBM®.

In embodiments of the invention, the dependent design operations can occur prior to T-0, subsequent to T-0, and/or overlapping with T-0. In addition to predicting the dependency relationships between applied design operations and dependent design operations, the collaboration dependency model is also trained to identify the designers responsible for the applied design operations and their associated dependent design operations, as well as generating communications to the designers about their applied design operations and their associated dependent design operations. Example communications include alerts identifying the dependency relationship(s), the above-described recommendations/explanations for resolving conflicts between applied and dependent design operations, and/or reports that identify the impact of design operations (and/or design changes) on the overall design/engineering team. In embodiments of the invention, the reports can be used to improve the efficiency of the design/engineering team. Thus, in embodiments of the invention, the dependency relationship can be between applied design operations and various aspects of the 3D physical object, including but not limited to dependency design operations, design parameters, designers, designers who are impacted by the applied design operation, designers who are not impacted by the applied design operation, and factors that contribute to the impact of applied design operations.

In embodiments of the invention, the machine learning algorithms and models used in aspects of the invention can include, for example, classification, regression, clustering, decision-trees, and the like. In general, classification machine learning algorithms/model can include methods such as logistic regression and support vector machines can be used to classify the designers into classes such as designers who are impacted by the applied design operation and the designers who are not impacted by the applied design operation. Regression machine learning algorithms/models can include methods such as linear regression and decision trees used to predict the magnitude of the impact of a given applied design operation for each designer on the design/engineering team. Clustering machine learning algorithms/models can include using methods such as k-means to cluster the designers into groups based on the similarity of the impact of their applied design operations. Decision trees can be used in machine learning algorithms/models to identify the most important factors that contribute to the impact of applied design operations.

Embodiments of the invention can be applied to a variety of devices that are being designed and/or improved. Embodiments of the invention are particularly useful where the device-under-design has a large number of design operations with complicated relationships between applied design operations and dependent design operations. Examples devices include non-planar active semiconductor devices, automobiles, robotic arms, aircrafts, manufacturing equipment, and the like.

Turning now to a more detailed description of the aspects of the invention, FIG. 1 depicts a diagram illustrating a VR collaborative design system 100 according to embodiments of the invention. In aspects of the invention, the system 100 is an immersive 360-degree video system that includes a host server 130 in communication with remote user terminals 102A, 102B and local terminals (or displays) 148 over networks 120A, 120B (e.g., the Internet). Remote users 110, which are depicted as User-A and User-B, interface with the system 100 through remote user terminals 102A, 102B; and a local user(s) 140 interfaces with the system 100 using display 148. Although only two remote users 110 are shown any number of remote users 110 can be provided. In embodiments of the invention, the displays 148 and/or the remote terminals 102A, 102B can be implemented as a head mounted display (HMD) 150 or a non-HMD (NHMD) 160. The NHDM 160 can be a stand-alone flat panel display or a flat panel display integrated with another device such as a smartphone or a laptop. The HMD 150 is configured to be worn by the local user 140 (or the remote users 110). Both the HMD 150 and the NHMD 160 can be in wired or wireless communication with manipulation device(s) 152 (e.g., a three-dimensional mouse, data gloves, etc.) configured to be worn by and/or otherwise controlled/used by the local user 140 (and/or the remote users 110).

The host server 130 is in wired and/or wireless communication with the display(s) 148 and remote user terminals 102A, 102B. In embodiments of the invention, the host server includes a full range of CAD/CAM and/or simulation functionality (not shown separately from the host server 130). In accordance with aspects of the invention, the host server 130 further includes a 3D device-under-design (DUD) model 132 (i.e., a 3D model of a DUD), a temporal collaboration dependency mapping module 134, and an avatar generation module 136, configured and arranged as shown. In embodiments of the invention, the temporal collaboration dependency mapping module 134 includes a machine learning algorithm trained to create a collaboration dependency model operable to predict upstream and/or downstream (i.e., temporal) dependency relationships between the various design operations applied to a 3D DUD model 132 that is being designed and/or updated by the remote users 110 and/or the local user 140. The machine learning algorithm trains the temporal collaboration dependency model to perform the task of predicting the upstream and/or downstream dependent design operations of an applied design operation. In embodiments of the invention, an applied design operation is a design operation applied (e.g., using CAD/CAM functionality) by the remote users 110 and/or the local user 140 at time-zero (T-0), and the dependent design operations are the one or more design operations that are impacted by the applied design operation. In some embodiments of the invention, in addition to identifying the existence of the dependent design operations, the temporal collaboration dependency model can further include NLP functionality that provides explanations and/or recommendations related to the applied and dependent design operations. In embodiments of the invention, the recommendations/explanations can be implemented using a computer-based Q&A module operable to generate an answer to natural language questions that are either pre-set or presented by the remote users 110 and/or the local user 140. In embodiments of the invention, the dependent design operations can occur prior to T-0, subsequent to T-0, and/or overlapping with T-0. In addition to predicting the dependency relationships between applied design operations and dependent design operations, the collaboration dependency model is also trained to identify the remote users 110 and/or the local user 140 responsible for the applied design operations and their associated dependent design operations, as well as generating communications to the remote users 110 and/or the local user 140 about their applied design operations and their associated dependent design operations. Example communications include alerts identifying the dependency relationship(s), the above-described recommendations/explanations for resolving conflicts between applied and dependent design operations, and/or reports that identify the impact of design operations (and/or design changes) on the overall design/engineering team. In embodiments of the invention, the reports can be used to improve the efficiency of the remote users 110 and/or the local user 140. Additional details of how the temporal collaboration dependency mapping module 134 can be implemented are depicted in FIGS. 5 and 6 and described in greater details subsequently herein.

A cloud computing system 50 is in wired or wireless electronic communication with the system 100, and in particular with the host server 130. The cloud computing system 50 can supplement, support or replace some or all of the functionality (in any combination) of the system 100. Additionally, some or all of the functionality of the system 100 can be implemented as a node of the cloud computing system 50. Additional details of cloud computing functionality that can be used in connection with aspects of the invention are depicted by the computing environment 1000 shown in FIG. 10 and described in greater detail subsequently herein.

Figure 2:
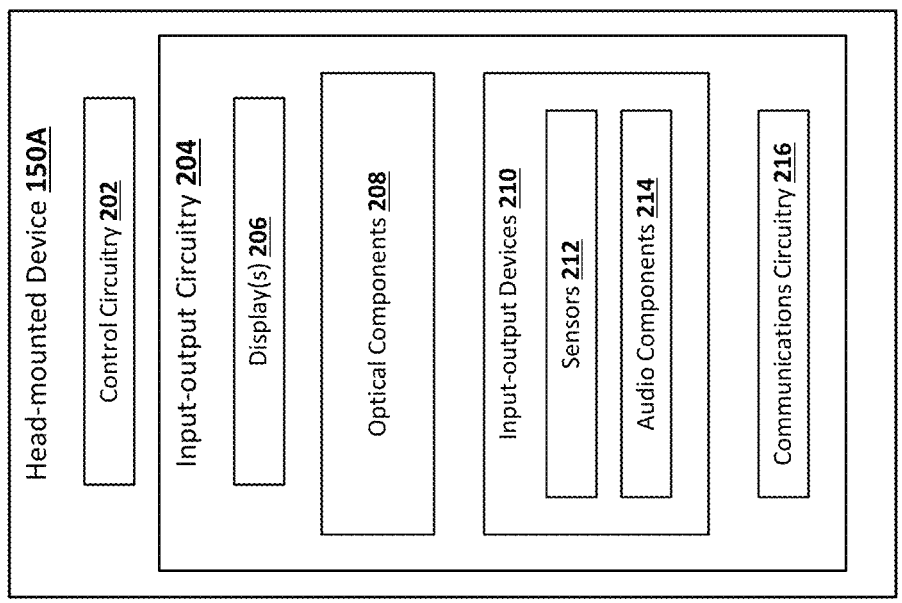
FIG. 2 depicts details of a head-mounted-device (HMD) according to embodiments of the invention.

FIG. 2 depicts an HMD 150A, which is a non-limiting example of how the HMD 150 (shown in FIG. 1) can be implemented. In accordance with aspects of the invention, the HMD 150A includes control circuitry 202 and input-output circuitry 204, configured and arranged as shown. The input-output circuitry 204 includes display(s) 206, optical components 208, input-output devices 210, and communications circuitry 218, configured and arranged as shown. The input-output devices 210 include sensors 212 and audio components 214, configured and arranged as shown. The various components of the HMD 150A can be supported by a head-mountable support structure such as a pair of glasses; a helmet; a pair of goggles; and/or other head-mountable support structure configurations.

In embodiments of the invention, the control circuitry 202 can include storage and processing circuitry for controlling the operation of the HMD 150A. The control circuitry 202 can include storage such as hard disk drive storage, non-volatile memory (e.g., electrically-programmable-read-only memory configured to form a solid-state drive), volatile memory (e.g., static or dynamic random-access-memory), etc. Processing circuitry in the control circuitry 202 can be based on one or more microprocessors, microcontrollers, digital signal processors, baseband processors, power management units, audio chips, graphic processing units, application specific integrated circuits, and other integrated circuits. Computer program instructions can be stored on storage in the control circuitry 202 and run on processing circuitry in the control circuitry 202 to implement operations for HMD 150A (e.g., data gathering operations, operations involving the adjustment of components using control signals, image rendering operations to produce image content to be displayed for a user, etc.).

The input-output circuitry 204 can be used to allow the HMD 150A to receive data from external equipment (e.g., the wall agent module 110 (shown in FIG. 1); a portable device such as a handheld device; a laptop computer; or other electrical equipment) and to allow the user 140 (shown in FIG. 1) to provide the HMD 150A with user input. The input-output circuitry 204 can also be used to gather information on the environment in which HMD 150A is operating. Output components in the input-output circuitry 204 can allow the HMD 150A to provide the user 140 with output and can be used to communicate with external electrical equipment.

Display(s) 206 of the input-output circuitry 204 can be used to display images (e.g., the full 360-degree video frame 200 (shown in FIG. 2B)) to the user 140 (shown in FIG. 1) of the HMD 150A. The display(s) 206 can be configured to have pixel array(s) to generate images that are presented to the user 140 through an optical system. The optical system can, if desired, have a transparent portion through which the user 140 (viewer) can observe real-world objects while computer-generated content is overlaid on top of the real-world objects by producing computer-generated images (e.g., the full 360-degree video frame 200) on the display(s) 206. In embodiments of the invention, the display(s) 206 are immersive views of the full 360-degree video frame 200, wherein the display(s) 206 place tiny screens and lenses close to the user's eyes to simulate large screens that encompass most of the user's field of view. As the user 140 performs actions like walking, head rotating (i.e., changing the point of view), data describing behavior of the user 140 (shown in FIG. 1) is fed to the computing system 110 (shown in FIG. 1) from the HMD 150A and/or the manipulation devices 152 (shown in FIG. 1).

The optical components 208 can be used in forming the optical system that presents images to the user 140. The optical components 208 can include static components such as waveguides, static optical couplers, and fixed lenses. The optical components 208 can also include adjustable optical components such as an adjustable polarizer, tunable lenses (e.g., liquid crystal tunable lenses; tunable lenses based on electro-optic materials; tunable liquid lenses; microelectromechanical system tunable lenses; or other tunable lenses), a dynamically adjustable coupler, and other optical devices formed from electro-optical materials (e.g., lithium niobate or other materials exhibiting the electro-optic effect). The optical components 208 can be used in receiving and modifying light (images) from the display 206 and in providing images (e.g., the full 360-degree video frame 200) to the user 140 for viewing. In some embodiments of the invention, one or more of the optical components 208 can be stacked so that light passes through multiple of the components 208 in series. In embodiments of the invention, the optical components 208 can be spread out laterally (e.g., multiple displays can be arranged on a waveguide or set of waveguides using a tiled set of laterally adjacent couplers). In some embodiments of the invention, both tiling and stacking configurations are present.

The input-output devices 210 of the input-output circuitry 204 are configured to gather data and user input and for supplying the user 140 (shown in FIG. 1) with output. The input-output devices 210 can include sensors 212, audio components 214, and other components for gathering input from the user 140 and/or or the environment surrounding the HMD 150A and for providing output to the user 140. The input-output devices 210 can, for example, include keyboards; buttons; joysticks; touch sensors for trackpads and other touch sensitive input devices; cameras; light-emitting diodes; and/or other input-output components. For example, cameras or other devices in the input-output circuitry 204 can face the eyes of the user 140 and track the gaze of the user 140. The sensors 212 can include position and motion sensors, which can include, for example, compasses; gyroscopes; accelerometers and/or other devices for monitoring the location, orientation, and movement of the HDM 150A; and satellite navigation system circuitry such as Global Positioning System (GPS) circuitry for monitoring location of the user 140. The sensors 212 can further include eye-tracking functionality. Using the sensors 212, for example, the control circuitry 202 can monitor the current direction in which a user's head is oriented relative to the surrounding environment. Movements of the user's head (e.g., motion to the left and/or right to track on-screen objects and/or to view additional real-world objects) can also be monitored using the sensors 212.

In some embodiments of the invention, the sensors 212 can include ambient light sensors that measure ambient light intensity and/or ambient light color; force sensors; temperature sensors; touch sensors; capacitive proximity sensors; light-based proximity sensors; other types of proximity sensors; strain gauges; gas sensors; pressure sensors; moisture sensors; magnetic sensors; and the like. The audio components 214 can include microphones for gathering voice commands and other audio input and speakers for providing audio output (e.g., ear buds, bone conduction speakers, or other speakers for providing sound to the left and right ears of a user). In some embodiments of the invention, the input-output devices 210 can include haptic output devices (e.g., vibrating components); light-emitting diodes and other light sources; and other output components. The input-output circuitry 204 can include wired and/or wireless communications circuitry 216 that allows the HMD 150A (e.g., using the control circuitry 202) to communicate with external equipment (e.g., remote controls, joysticks, input controllers, portable electronic devices, computers, displays, and the like) and that allows signals to be conveyed between components (circuitry) at different locations in the HMD 150A.

Figure 3A:
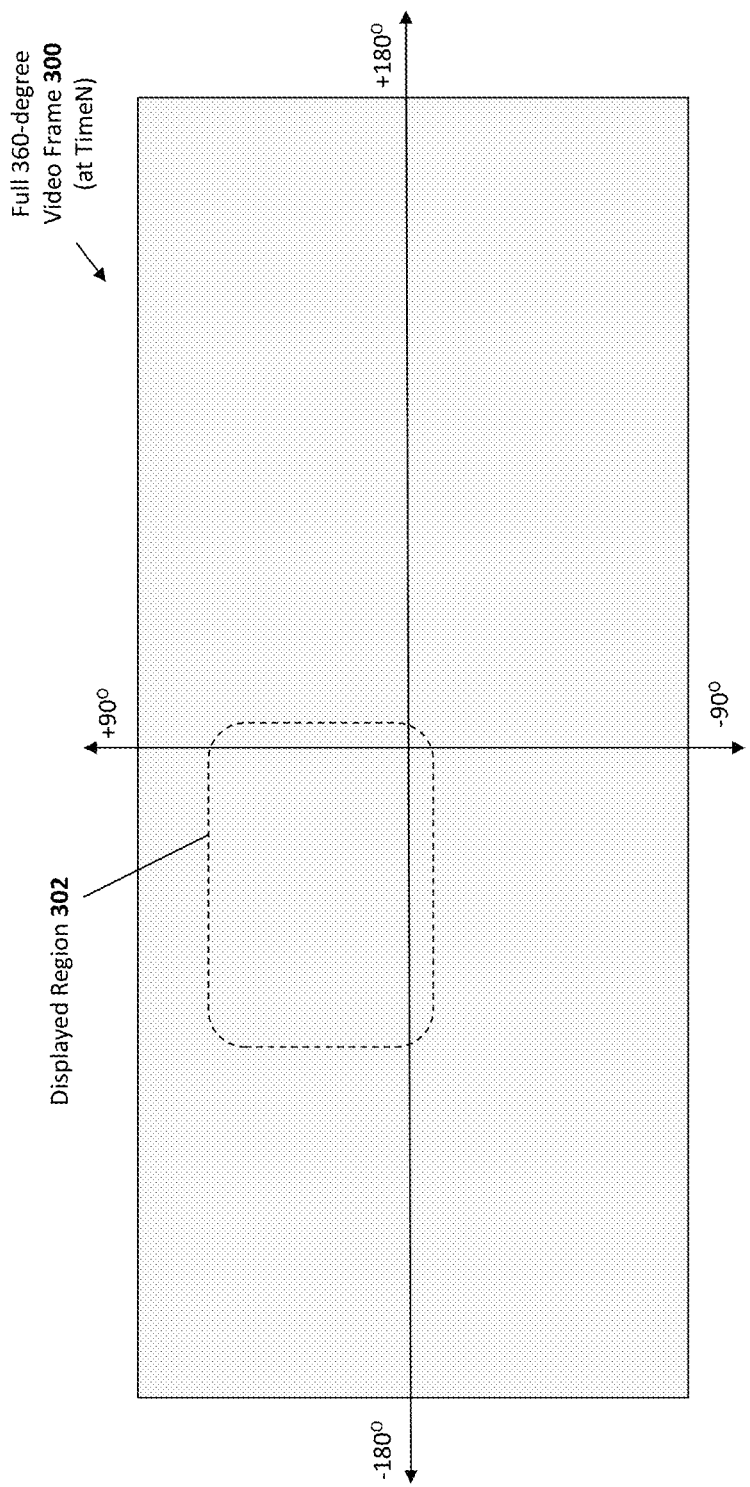
FIG. 3A depicts a block diagram illustrating additional details of a full 360-degree video frame according to embodiments of the invention.

FIG. 3A depicts a full 360-degree video frame 300 generated by the host server 130. In embodiments of the invention, the host server 130 is configured and arranged to generate streaming video/image data and transmit the same over the networks 120A, 120B, along with local user behavior data and local user attribute data in input data stream 116 received from the user 140 (via display(s) 148) to generate the output data stream 118 and provide it to the display(s) 148. In embodiments of the invention, the displays 148 can be configured to support a function-API (application program interface) that allows a local user to input local user behavior data (e.g., adjust the displayed region 302 shown in FIG. 2B) to be input to the system 100 flexibly. In accordance with embodiments of the invention, the output data stream 118 includes the full 360-degree video frame 300 shown at a time denoted as TimeN. The full 360-degree video frame 300 is depicted in FIG. 3A as an equirectangular mapped 360-degree video frame where the yaw angle (−180 to +180 degrees) and the pitch angle (−90 to +90 degrees) are mapped to the x-axis and the y-axis, respectively. The full 360-degree video frame 300 can be a video recording where a view in every direction is recorded at the same time, shot using an omnidirectional camera or a collection of cameras. During playback on a normal flat display (e.g., the NHMD 160), the local user 140 has control of the viewing direction like a panorama. The full 360-degree video frame 300 can also be played on displays or projectors arranged in a sphere or some part of a sphere (not shown). The displayed region 302 (also known as the visible area or the user's viewpoint) of the full 360-degree video frame 300 can be displayed on the displays 148. In embodiments of the invention where the display 148 is incorporated within the HMD 150, immersive (i.e., 3D) views of the full 360-degree video frame 300 can be displayed to the local user 140 on a display (e.g., display 206 shown in FIG. 2) of the HMD 150, which places tiny screens and lenses close to the eyes of the local user 140 to simulate large screens. As the local user 140 performs actions like walking, head rotating (i.e., changing the point of view), data describing behavior of the local user 140 is fed through the input data stream 116 to the host server 130 from the HMD 150 and/or the manipulation devices 152. The host server 130 processes the information in real-time and generates appropriate feedback that is passed back to the user 140 by means of the output data stream 118.

Figure 3B:
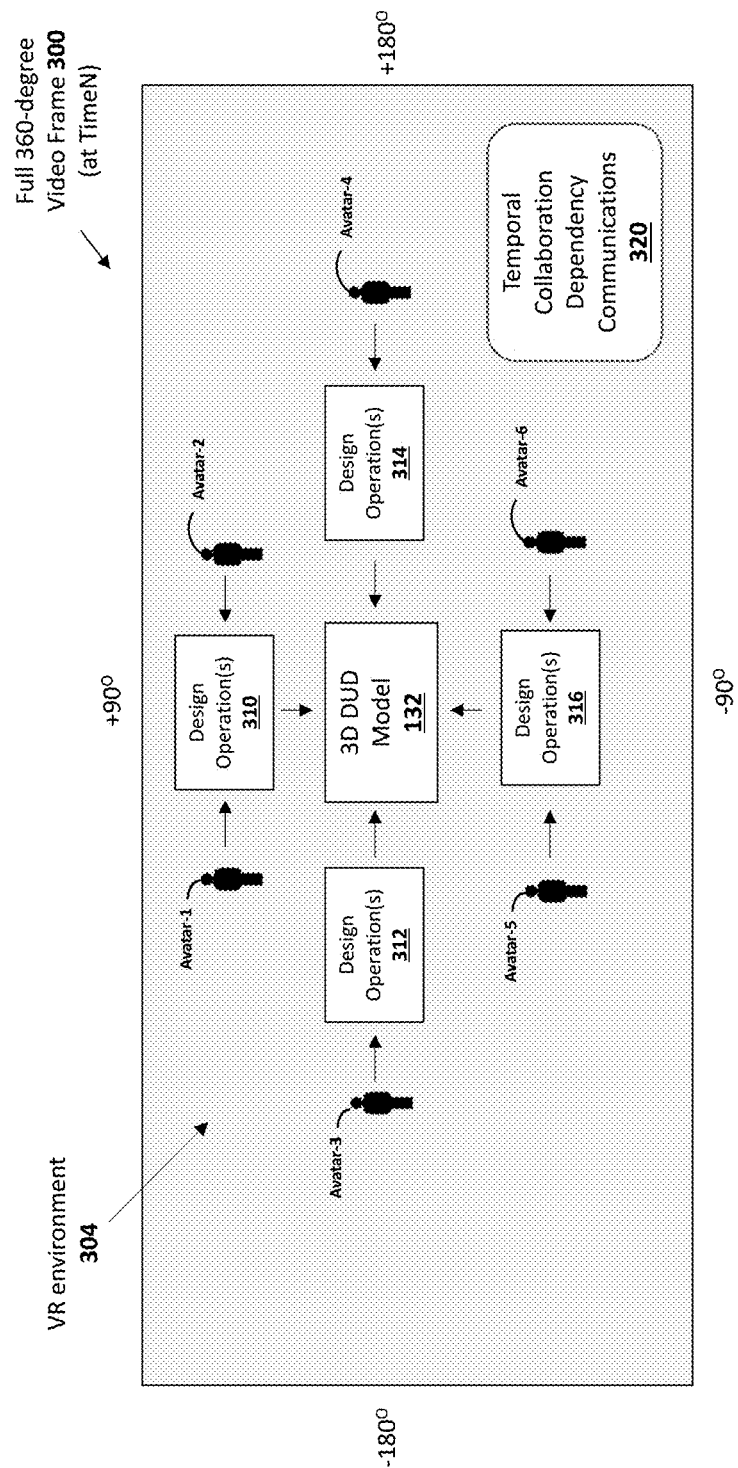
FIG. 3B depicts a block diagram illustrating additional details of a full 360-degree video frame according to embodiments of the invention.

FIG. 3B depicts a simplified example of a VR environment 304 that can be displayed to the remote users 110 and/or the local user 140 on the full 360-degree video frame 300 using the system 100 in accordance with aspects of the invention. The VR environment 304 displays a visual representation of the 3D DUD model 132; visual representations of various design operations 310, 312, 314, 316 virtually applied to the 3D DUD model 132; avatars, which are depicted as Avatar-1, Avatar-2, Avatar-3, Avatar-4, Avatar-5, and Avatar-6, that are visual representations the designers (e.g., remote users 110 and/or the local user 140) and their virtual actions in virtually applying a corresponding design operation (e.g., one or more of the design operations 310, 312, 314, 316) to the 3D DUD model 132; and temporal collaboration dependency communications 320, configured and arranged as shown. For ease of illustration, only six (6) avatars and four (4) design operations are shown. However, any number of design operations can be applied to the 3D DUD model 132. Similarly, any number of avatars can be provided because any number of remote users 110 and local users 140 can be provided. As depicted, Avatar-1 and Avatar-2 are currently working on virtual design operation(s) 310 that will be virtually applied to the 3D DUD model 132; Avatar-3 is currently working on virtual design operation(s) 312 that will be virtually applied to the 3D DUD model 132; Avatar-4 is currently working on virtual design operation(s) 314 that will be virtually applied to the 3D DUD model 132; and Avatar-5 and Avatar-6 are currently working on virtual design operation(s) 316 that will be virtually applied to the 3D DUD model 132. In accordance with embodiments of the invention, the VR environment is depicted at a time, TimeN. In accordance with aspects of the invention, the 3D DUD model 132 can represent 3D physical object that is being designed from the ground up, and/or the 3D DUD model 132 can represent a 3D physical object that is being redesigned or updated. Additional details of how the VR environment 304 can be generated in accordance with aspects of the invention are depicted in FIGS. 6 and 7 and described in greater detail subsequently herein.

Figure 4:
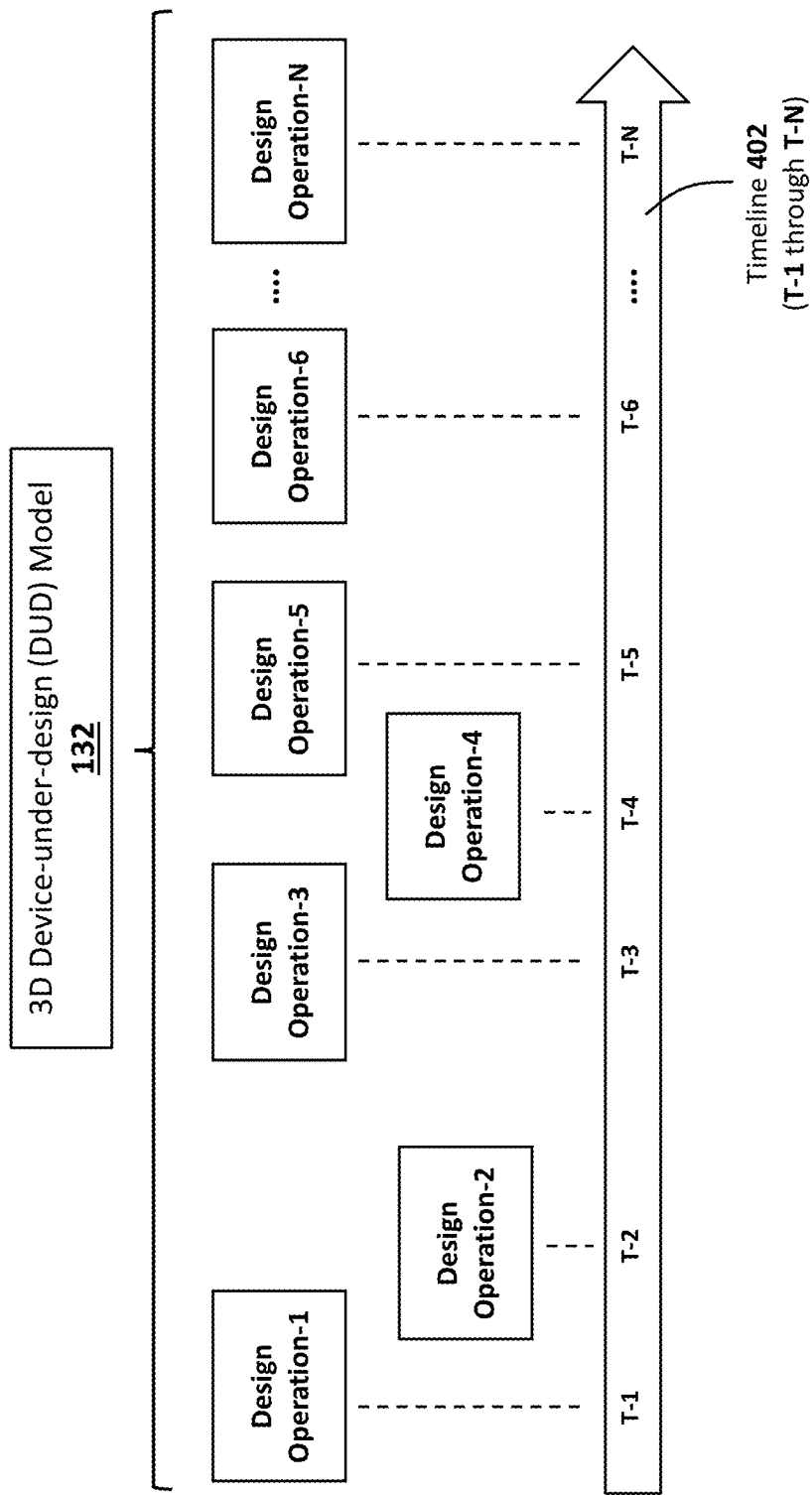
FIG. 4 depicts a block diagram illustrating temporal features of a system according to embodiments of the invention.

FIG. 4 depicts a block diagram illustrating temporal features of the VR environment 304 (shown in FIG. 3B) generated by the system 100 (shown in FIG. 1) according to embodiments of the invention. As depicted in FIG. 4, various design operations (Design Operation-1 through Design Operation-N, where N is a whole number greater than six (6)) are depicted along a timeline 402, which shows T-1 through T-N, where N is a whole number greater than six (6). The "Design Operations" depicted in FIG. 4 correspond to the Design Operation(s) 310, 312, 314, 316 shown in FIG. 3B. In the example where the 3D DUD 132 represents a non-planar transistor (e.g., FinFET 132A shown in FIG. 5A), the design operations shown in FIGS. 3B and 4 include electronic representations or simulations (e.g., animated video and/or audio) of various semiconductor operations.

The design operations depicted in FIGS. 3B and 4 can include the various processes used to form a micro-chip that will be packaged into an IC. Such design operation fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage.

By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Returning to FIG. 4, moving from left to right, at T-1 Design Operation-1 is virtually applied to the 3D DUD model 132. Subsequent to initiating the virtual application of Design Operation-1 but prior to completing the virtual application of Design Operation-1, Design Operation-2 is initiated and virtually applied to the 3D DUD model 132 at T-2. Thus, there is a time overlap between Design Operation-1 and Design Operation-2. At T-3, Design Operation-3 is virtually applied to the 3D DUD model 132. Subsequent to initiating the virtual application of Design Operation-3 but prior to completing the virtual application of Design Operation-3, Design Operation-4 is initiated and virtually applied to the 3D DUD model 132 at T-4. Additionally, subsequent to initiating the virtual application of Design Operation-4 but prior to completing the virtual application of Design Operation-4, Design Operation-5 is initiated and virtually applied to the 3D DUD model 132 at T-5. Thus, there is a time overlap between Design Operation-3, Design Operation-4, and Design Operation-5. At T-6, Design Operation-6 is virtually applied to the 3D DUD model 132. At T-N, Design Operation-N is virtually applied to the 3D DUD model 132. In accordance with aspects of the invention, the system 100 (shown in FIG. 1) can be used to identify the Design Operations that have a dependency relationship. For example, when Design Operation-1 is applied, Design Operation-1 is an applied design operation, and embodiments of the invention identify or predict which ones of Deign Operation-2 through Design Operation-N are dependent design operations to Design Operation-1. Similarly, when Design Operation-4 is applied, Design Operation-4 is an applied design operation, and embodiments of the invention identify or predict which ones of Deign Operation-1 through Design Operation-3 and Deign Operation-5 through Design Operation-N are dependent design operations to Design Operation-4. Additional details of how the system 100 (shown in FIG. 1) can be used to identify or predict the dependency relationships depicted in FIG. 4 in accordance with aspects of the invention are depicted in FIGS. 6 and 7 and described in greater detail subsequently herein.

Figure 5A:
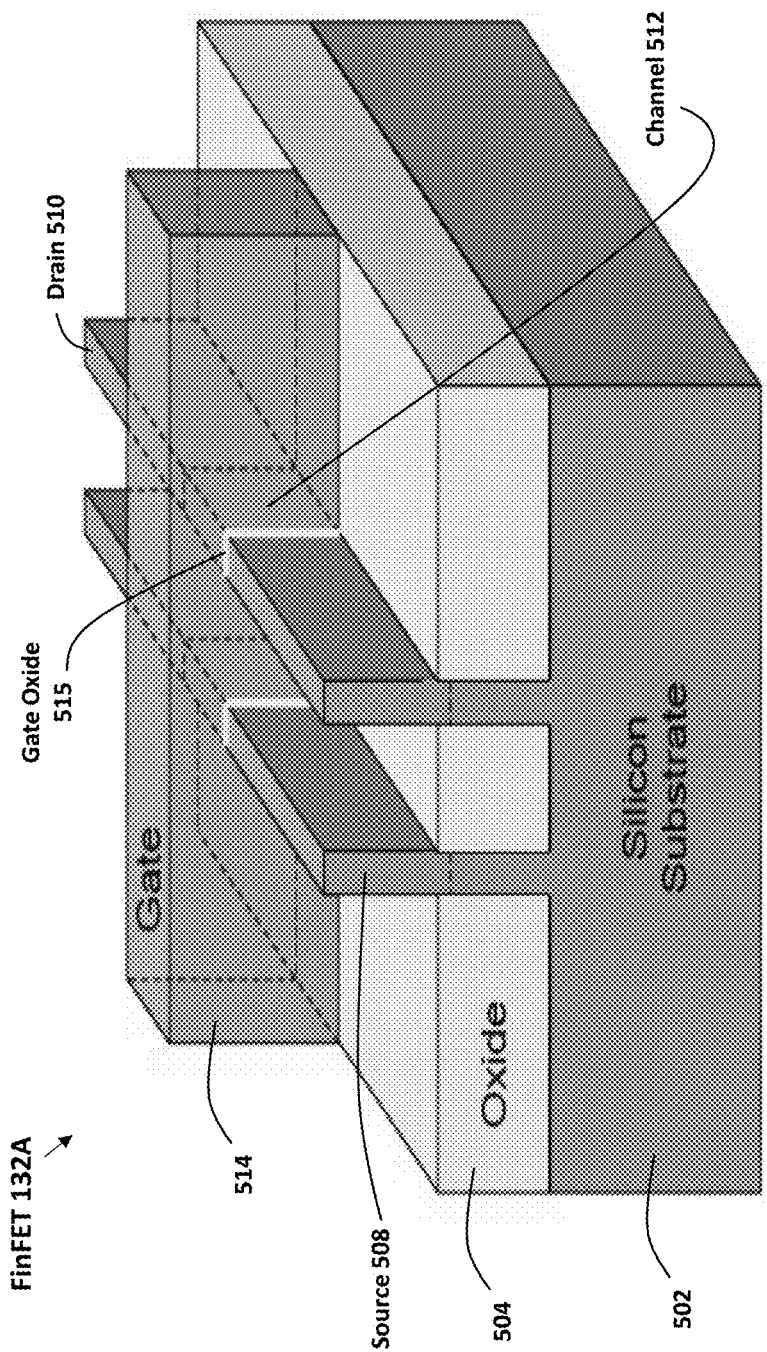
FIG. 5A depicts an example of a three-dimensional (3D) device that can be designed using embodiments of the invention.
Figure 6:
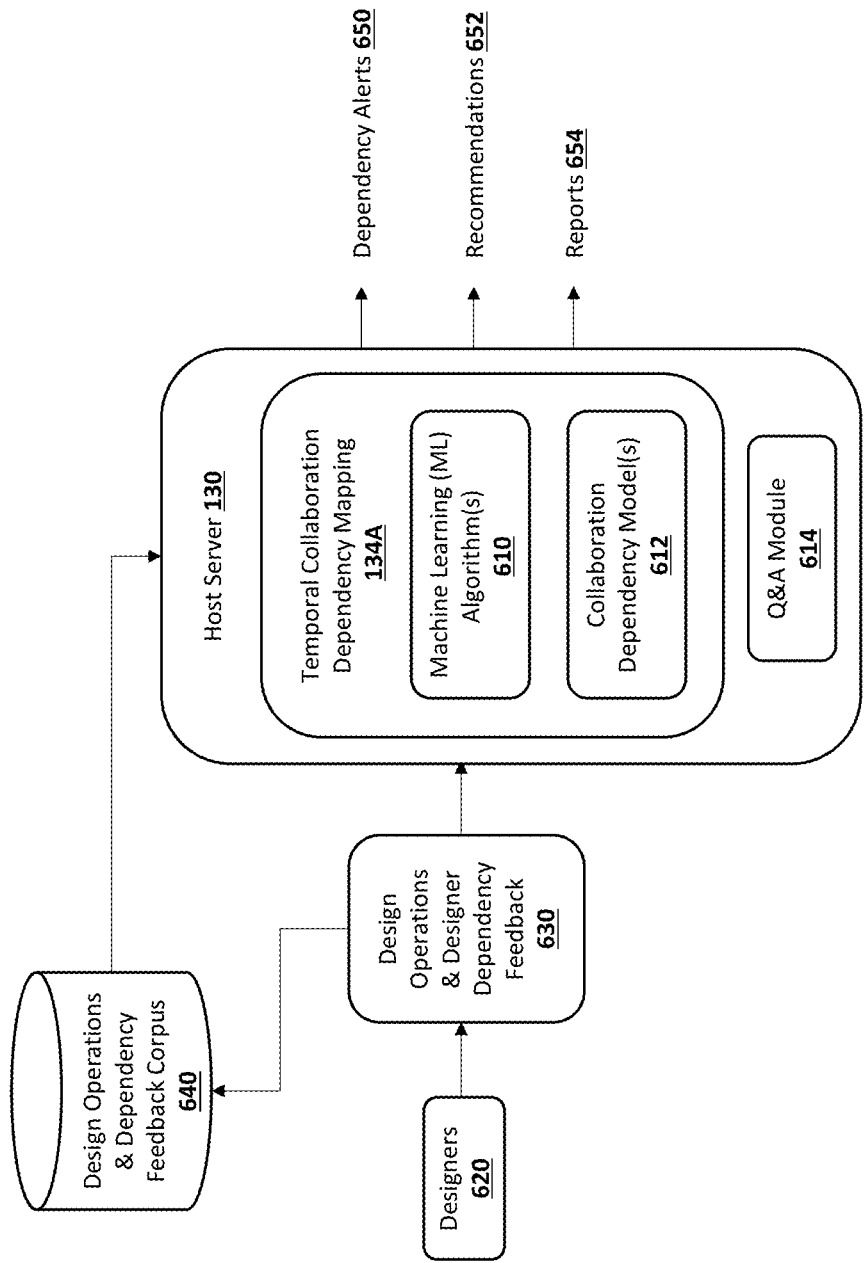
FIG. 6 depicts a block diagram illustrating additional details of a temporal collaborative dependency mapping system according to embodiments of the invention.

FIG. 5A depicts a fin-type field effect transistor (FinFET) 132A, which is a non-limiting example of a 3D physical object that can be represented as a 3D DUD model 132 and designed and/or updated using embodiments of the invention. Typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Such MOSFETs are relatively simple devices described generally as "planar" device architectures.

In contemporary semiconductor device fabrication processes, a large number of semiconductor devices, such as n-type field effect transistors (nFETs) and p-type field effect transistors (pFETs), are fabricated on a single wafer. Non-planar transistor device architectures, such as FinFETs and nanosheet (or nanowire) transistors, can provide increased device density and increased performance over planar transistors. In a known FinFET architecture, the channel is formed as a high aspect-ratio fin-shaped structure. A gate runs along sidewalls and a top surface of a central portion of the fin, and the central portion of the fin functions as the FinFET channel. Nanosheet transistors include a gate stack that wraps around the full perimeter of multiple nanosheet channel regions for improved control of channel current flow.

Referring still to FIG. 5A, the non-planar FinFET 132A is depicted as adjacent FinFET devices having a shared gate 514. The FinFET 132A includes a semiconductor substrate 102, a shallow trench isolation (STI) oxide layer 104, fins 108/112/110, and a shared gate 114, configured and arranged as shown. Each fin 108/112, 110 includes a source region 108, a drain region 110 and a channel region 112, wherein the shared gate 114 extends over the top and sides of channel regions 112. A gate oxide 515 is between the shared gate 514 and the channel regions 512. The substrate 102 can be silicon; the STI 104 can be an oxide (e.g., $SiO_2$); and the fin 108/112/110 can be silicon alone or silicon that has been enriched to a desired concentration level of germanium. The shared gate 114 controls the current flow from the source 508 through the channel 512 to the drain 510. In contrast to planar MOSFETs, source 108, drain 110 and channel 112 are built as a 3D on extending from the substrate 102 and through the STI layer 104. The 3D bar is the aforementioned fin 108/112/110, which serves as the body of the FinFET 132A. The shared gate 514 is wrapped over the top and sides of the fins 108/112/110, and the portions of the fins 108/112/110 that are under the shared gate 514 as the channel 512. The source 108 and drain 110 are the portions of the fin 108/112/110 on either side of the channel 112 that are not under the shared gate 514. The dimensions of the fin 108/112/110 establish the effective channel length for the FinFET 132A.

Current non-planar architectures have moved to 3D transistors architectures (e.g., gate-all-around; nanosheet channels/sources/drains; and stacked 3D transistors) that are increasingly more complex and that include increasingly more complex fabrication operations and design operation dependency relationships. IC chip integration and fabrication for such architectures have become even more complex requiring multiple 100's of process steps. Each process step will often involve, in fact, multiple process steps, examples of which include wet cleans, furnace anneals, measurements steps (data feed forward for lithography), and others. Even for experts in IC design and fabrication, it is difficult to envision the 3D architecture and fabrication details of a DUD in all of its particular details. The development of the integration process requires multiple modules (STI, sheet formation and source/drain epitaxy, gate stack, contacts, wiring, and the like). Each module is complex in itself and each module interacts/effects downstream and upstream module (i.e., temperature limitations for epitaxial growth or gate stack reliability). Embodiments of the invention provide a VR design environment (e.g., VR environment 304 shown in FIG. 3B) that enables designers (e.g., remote users 110 and/or local user 140) engineer to envision the upstream and downstream effects a design operation or process changes will have on other modules.

Figure 5B:
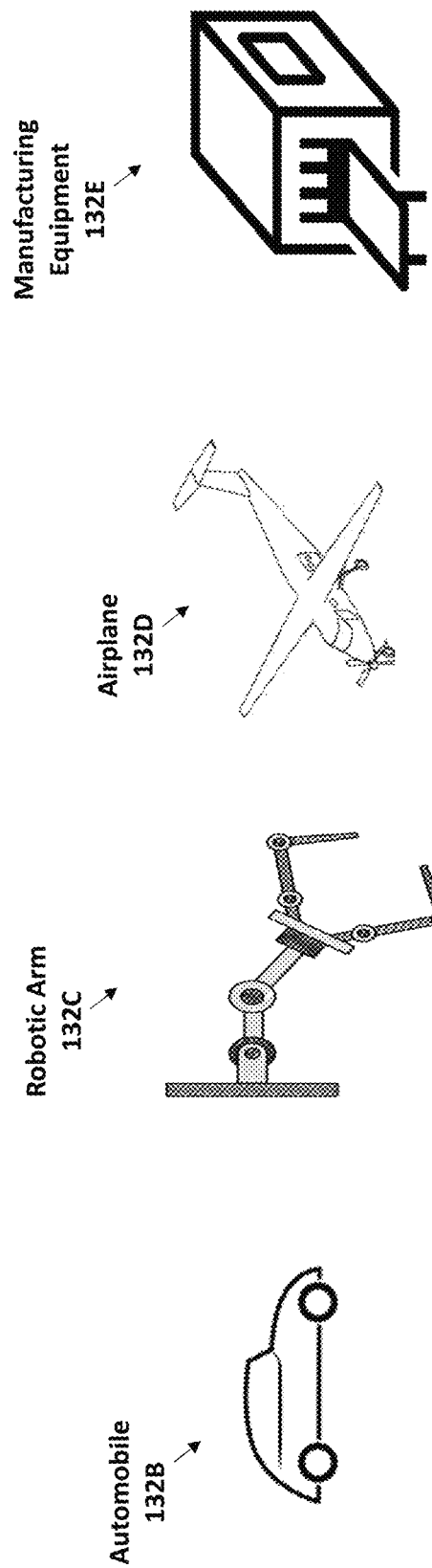
FIG. 5B depicts additional examples of 3D devices that can be designed using embodiments of the invention.

Although embodiments of the invention described in this detailed description focus on an example where the 3D physical object modeled by the 3D DUD model 132 is a non-planar transistor such as the FinFET 132A, embodiments of the invention can apply to a wide variety of 3D physical objects have design complexity, fabrication complexity, and dependency relationship complexity similar to the non-planar 3D transistors. FIG. 5B depicts examples of Other 3D physical objects that can modeled by the 3D DUD model 132 in accordance with embodiments of the invention, including, but not limited to, automobiles 132B, robotic arms 132C, airplanes 132D, manufacturing equipment 132E, and the like.

FIG. 6 depicts a block diagram illustrating additional details of how the host server 130 can be implemented in accordance with embodiments of the invention to include a temporal collaboration dependency mapping module 134A and a Q&A module 614 in accordance with embodiments of the invention. In aspects of the invention, the temporal collaboration dependency mapping module 134A includes ML algorithms 610 operable to create collaboration dependency models 612 according to embodiments of the invention. The various ML models of the host server 130 can be trained using design operations & designer dependency feedback 630 from designers 620, along with a design operations & dependency feedback corpus 640. In embodiments of the invention, the host server 130 shown in FIG. 6 is a more detailed implementation example of the host server 130 shown in FIG. 1; and the designers 620 correspond to the remote users 110 and/or the local user 140 show in FIG. 1. In accordance with embodiments of the invention, the host server 130 is operable to generate dependency alerts 650, recommendations 652, and/or reports 654, which correspond, in general, to the temporal collaboration dependency communications 320 depicted in FIG. 3B.

In embodiments of the invention, the Q&A module 614 is operable to generate an answer to natural language questions that are either pre-set or presented by one or more of the designers. As a non-limiting example, the Q&A module 614 can include all of the features and functionality of a DeepQA technology developed by IBM®. DeepQA is a Q&A system that can conduct an interrogation on any subject (e.g., the impact of an applied design operations on associated dependent design operations) by applying elements of natural language processing, machine learning, information retrieval, hypothesis generation, hypothesis scoring, final ranking, and answer merging to arrive at a conclusion. Q&A systems such as IBM's DeepQA technology often use unstructured information management architecture (UIMA), which is a component software architecture for the development, discovery, composition, and deployment of multimodal analytics for the analysis of unstructured information and its integration with search technologies developed by IBM®.

FIG. 7 depicts a flow diagram illustrating a computer-implemented methodology 700 that can be implemented using the system 100 (shown in FIG. 1) in general, and more specifically, using the host server 130 (shown in FIGS. 1 and 6) according to embodiments of the invention. The methodology 700 will now be described with reference, where appropriate to the corresponding structures shown in FIGS. 1-6, along with the methodology 700 shown in FIG. 7. The methodology 700 starts at block 702 then moves to block 704 where a baseline 3D DUD model is built. In some embodiments of the invention, the baseline 3D DUD model is a ground-up design, and in some embodiments of the invention, the baseline 3D DUD model is related to the construction of a next-generation technology node. In embodiments of the invention, a restricted corpus of the designers 620 begin with a baseline 3D model of a DUD, which is a non-planar 3D transistor node. The baseline 3D model includes geometric features of the DUD and fabrication process steps. In aspects of the invention, the baseline 3D model can include the following; an nFET cut, which is this is the feature that is being cut into the n-type region; a pFET cut, which is the feature that is being cut into the p-type region; an N2P space, which is the distance between the n-type and p-type regions; a gate, which is the feature that is being deposited on top of the n-type and p-type regions; and a cavity, which is the feature that is being etched into the gate The baseline 3D model of the DUD also tracks associated fabrication process steps that include epitaxial growth operations, which are the steps where the n-type and p-type regions are epitaxially grown; lithography, which is the step where the gate is patterned; etching operations, which are the steps where the features such as the gate are etched; and deposition operations, which are the steps where the features such as the gate are deposited.

The baseline 3D model is then populated with default process parameters for each of the process steps. The baseline 3D model is also populated with default material properties for each of the materials, default device physics for each of the devices, and default electrical properties for each of the conductive elements. The baseline 3D model generated at block 704 is then the baseline against which all future changes or design operations will be compared.

At block 706, the methodology 700 uses the system 100, including specifically the host server 130 depicted in FIG. 6, to perform social collaboration operations on the baseline 3D model in the VR environment 304 (shown in FIG. 3B). The designers 620 utilize the baseline 3D model built at block 704 to collaborate on the construction of a DUD as a next-generation technology node (e.g., a next-generation technology node of the FinFET 132A shown in FIG. 5A). The designers 620 at block 706 can include roles such as epitaxy designers/engineers, insulator designers/engineers, device designers/engineers, wet process designers/engineers, and lithography designers/engineers. The designers 620 begin by loading the 3D model into a metaverse platform such as the host server 130. The metaverse platform is a computer-generated environment (e.g., VR environment 304 shown in FIG. 3B) where the designers 130 can interact with each other and with virtual objects. The computer-generated environment is then populated with baseline 3D model and avatars (e.g., avatars 136 shown in FIG. 1; and Avatar-1 through Avatar 6 shown in FIG. 3B) representing each of the designers 620. The avatars are used to navigate the 3D model and to interact with each other in the computer-generated environment. The designers 620 collaborate on the construction of the next-generation technology node from the baseline 3D model, and the designers 620 use a variety of tools to collaboratively edit the baseline 3D model in the computer-generated environment.

At block 708, social collaboration dependency mapping is enabled within the computer-generated environment (e.g., the VR environment 304 shown in FIG. 3B) by using the ML algorithms 610 of the temporal collaboration dependency mapping module 134A (shown in FIG. 6) to begin generating or training the collaboration dependency models 612 (shown in FIG. 6). The ML algorithms 610 train the collaboration dependency model 612 to map the dependencies between the designers 620, and more particularly between the design operations performed by the designers 620 during the construction of the DUD next-generation technology node. For example, a design operation performed by a designer 620 at one step can directly impact, for example, a wet process designer at an upstream or downstream step. In accordance with aspects of the invention, the host server 130 is operable to receive feedback (e.g., design operations & designer dependency feedback 630) from the designers 620 related the positive and negative outcome of changes to the 3D model at a given step. The ML algorithm 610 uses the feedback to train the collaboration dependency model 612 to generate a social collaboration dependency map or model that can be used to identify or predict the upstream or downstream design operations and designers 620 that are impacted by changes made at a given step. The ML algorithms 610 used to generate the collaboration dependency model 612 can include, but is not limited to is dependency map/model can be generated using machine learning methods such as, classification, regression, clustering, decision-trees, and the like. In general, classification machine learning algorithms/models can include methods such as logistic regression and support vector machines can be used to classify the designers 620 into classes such as designers who are impacted by the applied design operation and the designers who are not impacted by the applied design operation. Regression machine learning algorithms/models can include methods such as linear regression and decision trees used to predict the magnitude of the impact of a given applied design operation for each designer 620 on the design/engineering team. Clustering machine learning algorithms/models can include using methods such as k-means to cluster the designers 620 into groups based on the similarity of the impact of their applied design operations. Decision trees can be used in machine learning algorithms/models to identify the most important factors that contribute to the impact of applied design operations.

In embodiments of the invention, the collaboration dependency models 612 can be trained to generate dependency alerts 650 when a change is made at a given step. The dependency alerts 650 are sent to the designers 620 that are impacted by the change. In some embodiments of the invention, the collaboration dependency models 612 can be trained to work in tandem with the Q&A module 614 to recommend alternative actions to the designers 620 when the model 612 and the module 614 determine that there is a conflict between design operations being advanced by designers 620. For example, if a change impacts a wet process engineer at a given step, the collaboration dependency model 612 and the Q&A module 614 can recommend an alternative action to an impacted device engineer at a downstream or upstream step. In some embodiments of the invention, the collaboration dependency models 612 be trained to work in tandem with the Q&A module 614 to generate reports 654 that identify the impact of changes on the designers 620 as a team. The reports 654 can be used to improve the efficiency of the designers 620 as a team.

At block 710, as the baseline 3D model continues to evolve at block 708, the scope of the designers 620 can be expanded to include a wider range of engineers from different disciplines, including, but not limited to, electrical engineers; computer scientists; designers; manufacturing & quality engineers; process engineers; and the like. As the corpus of designers 620 widens, the host server 130 continues collecting the comments left by the designers 620 to form a corpus of spatial and temporal data which can be used by the collaboration dependency model 612 and the Q&A module 614 to propose possible solutions to the team in the future based on the previous episodes. In some embodiments of the invention, a heat map can be used to identify the areas of the 3D model that are being worked on by the designers 620. The heat map can be used to improve the efficiency of the designers 620 as a team. When the 3D model is complete, it is exported to a file format that can be used by other applications. In embodiments of the invention, the complete 3D model, as wells as designer feedback from other iterations of the methodology 700 are stored in the design operations & dependency feedback corpus 640 and used to by the ML algorithms 610 to train the collaboration dependency model 612.

At block 712, as the completed 3D model is utilized over time, the users (or the designers 620) will be allowed to invoke searching commands for various progressions through the time and space (temporal & spatial) features of the collaboration dependency model 612. The features of block 712 will infuse the ability to yield both forward and reserve command driven dependency identification within the computer-generated environment (e.g., the system 100) generated in accordance with aspects of the invention.

Accordingly, embodiments of the invention enable an improved realization of the various benefits that flow from using the VR collaboration design system 100 (shown in FIG. 1). The system 100 enables the activities of teams that need to collaborate to perform a task to be performed by remotely-located collaborators meeting and performing CAD activities in a metaverse environment. The system 100 is a metaverse collaboration environment that, when implemented as a replacement for a corresponding physical environment, saves on power, space utilization, rent, and the ability to retain employees. VR headsets enhance the experience of the system 100 by incorporating 3D graphics (e.g., augmented reality), customizable dashboards, and other elements. Using the system 100, the collaborators do not need to be in the same room if they are in the same "virtual space," thus enabling them to collaborate even more effectively. The ability to virtually "travel" to various "places" in the metaverse of the system 100 enables an operator to virtually visit any number of remote physical locations and interface efficiently with the systems at the remote physical locations.

An example of machine learning techniques that can be used to implement aspects of the invention (e.g., the temporal collaboration dependency mapping module 134, 134A shown in FIGS. 1 and 6) will be described with reference to FIGS. 8A and 8B. Machine learning models configured and arranged according to embodiments of the invention will be described with reference to FIG. 8A.

Figure 8A:
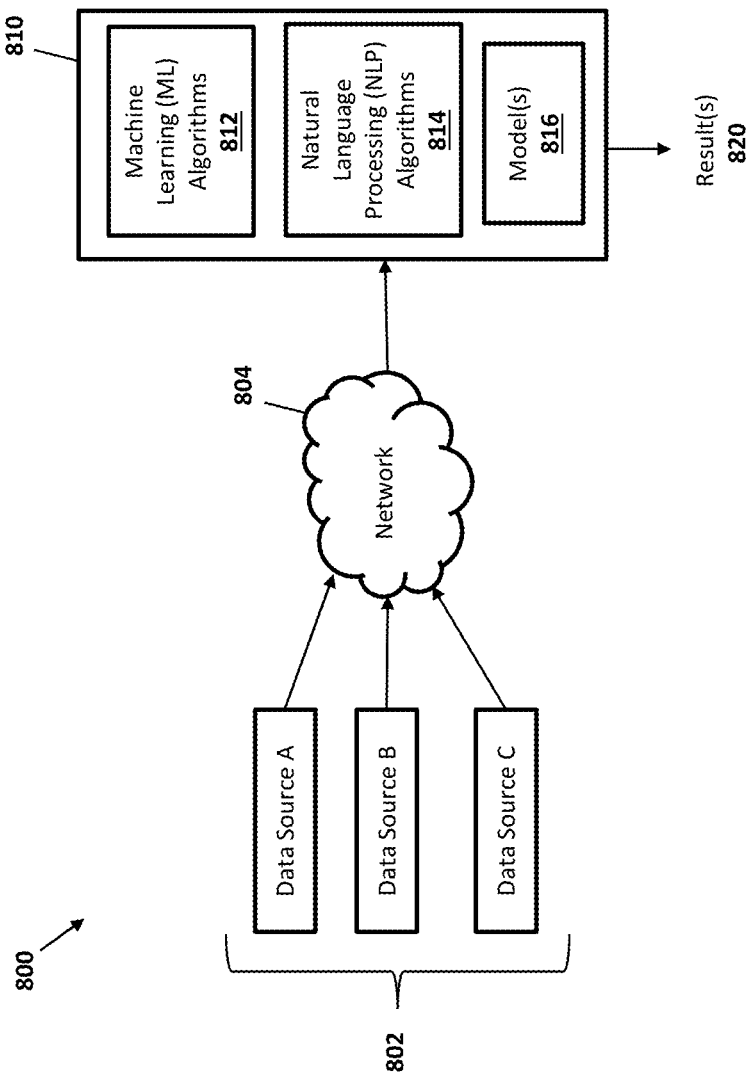
FIG. 8A depicts a machine learning system that can be utilized to implement aspects of the invention.

FIG. 8A depicts a block diagram showing a machine learning or classifier system 800 capable of implementing various aspects of the invention described herein. More specifically, the functionality of the system 800 is used in embodiments of the invention to generate various models and sub-models that can be used to implement computer functionality in embodiments of the invention. The system 800 includes multiple data sources 802 in communication through a network 804 with a classifier 810. In some aspects of the invention, the data sources 802 can bypass the network 804 and feed directly into the classifier 810. The data sources 802 provide data/information inputs that will be evaluated by the classifier 810 in accordance with embodiments of the invention. The data sources 802 also provide data/information inputs that can be used by the classifier 810 to train and/or update model(s) 816 created by the classifier 810. The data sources 802 can be implemented as a wide variety of data sources, including but not limited to, sensors configured to gather real time data, data repositories (including training data repositories), and outputs from other classifiers. The network 804 can be any type of communications network, including but not limited to local networks, wide area networks, private networks, the Internet, and the like.

The classifier 810 can be implemented as algorithms executed by a programmable computer such as a computing environment 1000 (shown in FIG. 11). As shown in FIG. 8A, the classifier 810 includes a suite of machine learning (ML) algorithms 812; natural language processing (NLP) algorithms 814; and model(s) 816 that are relationship (or prediction) algorithms generated (or learned) by the ML algorithms 812. The algorithms 812, 814, 816 of the classifier 810 are depicted separately for ease of illustration and explanation. In embodiments of the invention, the functions performed by the various algorithms 812, 814, 816 of the classifier 810 can be distributed differently than shown. For example, where the classifier 810 is configured to perform an overall task having sub-tasks, the suite of ML algorithms 812 can be segmented such that a portion of the ML algorithms 812 executes each sub-task and a portion of the ML algorithms 812 executes the overall task. Additionally, in some embodiments of the invention, the NLP algorithms 814 can be integrated within the ML algorithms 812.

The NLP algorithms 814 include speech recognition functionality that allows the classifier 810, and more specifically the ML algorithms 812, to receive natural language data (text and audio) and apply elements of language processing, information retrieval, and machine learning to derive meaning from the natural language inputs and potentially take action based on the derived meaning. The NLP algorithms 814 used in accordance with aspects of the invention can also include speech synthesis functionality that allows the classifier 810 to translate the result(s) 820 into natural language (text and audio) to communicate aspects of the result(s) 820 as natural language communications.

The NLP and ML algorithms 814, 812 receive and evaluate input data (i.e., training data and data-under-analysis) from the data sources 802. The ML algorithms 812 includes functionality that is necessary to interpret and utilize the input data's format. For example, where the data sources 802 include image data, the ML algorithms 812 can include visual recognition software configured to interpret image data. The ML algorithms 812 apply machine learning techniques to received training data (e.g., data received from one or more of the data sources 802) in order to, over time, create/train/update one or more models 816 that model the overall task and the sub-tasks that the classifier 810 is designed to complete.

Figure 8B:
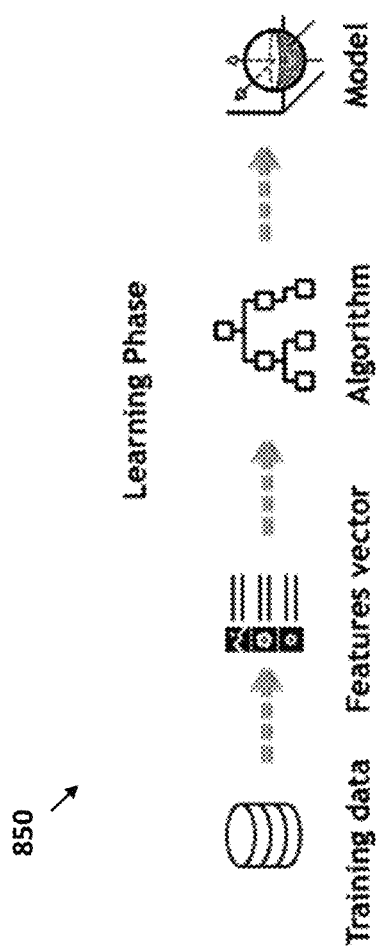
FIG. 8B depicts a learning phase that can be implemented by the machine learning system shown in FIG. 8A.

Referring now to FIGS. 8A and 8B collectively, FIG. 8B depicts an example of a learning phase 850 performed by the ML algorithms 812 to generate the above-described models 816. In the learning phase 850, the classifier 810 extracts features from the training data and coverts the features to vector representations that can be recognized and analyzed by the ML algorithms 812. The features vectors are analyzed by the ML algorithm 812 to "classify" the training data against the target model (or the model's task) and uncover relationships between and among the classified training data. Examples of suitable implementations of the ML algorithms 812 include but are not limited to neural networks, support vector machines (SVMs), logistic regression, decision trees, hidden Markov Models (HMMs), etc. The learning or training performed by the ML algorithms 812 can be supervised, unsupervised, or a hybrid that includes aspects of supervised and unsupervised learning. Supervised learning is when training data is already available and classified/labeled. Unsupervised learning is when training data is not classified/labeled so must be developed through iterations of the classifier 810 and the ML algorithms 812. Unsupervised learning can utilize additional learning/training methods including, for example, clustering, anomaly detection, neural networks, deep learning, and the like.

When the models 816 are sufficiently trained by the ML algorithms 812, the data sources 802 that generate "real world" data are accessed, and the "real world" data is applied to the models 816 to generate usable versions of the results 820. In some embodiments of the invention, the results 820 can be fed back to the classifier 810 and used by the ML algorithms 812 as additional training data for updating and/or refining the models 816.

In aspects of the invention, the ML algorithms 812 and the models 816 can be configured to apply confidence levels (CLs) to various ones of their results/determinations (including the results 820) in order to improve the overall accuracy of the particular result/determination. When the ML algorithms 812 and/or the models 816 make a determination or generate a result for which the value of CL is below a predetermined threshold (TH) (i.e., CL<TH), the result/determination can be classified as having sufficiently low "confidence" to justify a conclusion that the determination/result is not valid, and this conclusion can be used to determine when, how, and/or if the determinations/results are handled in downstream processing. If CL>TH, the determination/result can be considered valid, and this conclusion can be used to determine when, how, and/or if the determinations/results are handled in downstream processing. Many different predetermined TH levels can be provided. The determinations/results with CL>TH can be ranked from the highest CL>TH to the lowest CL>TH in order to prioritize when, how, and/or if the determinations/results are handled in downstream processing.

In aspects of the invention, the classifier 810 can be configured to apply confidence levels (CLs) to the results 820. When the classifier 810 determines that a CL in the results 820 is below a predetermined threshold (TH) (i.e., CL<TH), the results 820 can be classified as sufficiently low to justify a classification of "no confidence" in the results 820. If CL>TH, the results 820 can be classified as sufficiently high to justify a determination that the results 820 are valid. Many different predetermined TH levels can be provided such that the results 820 with CL>TH can be ranked from the highest CL>TH to the lowest CL>TH.

Figure 9:
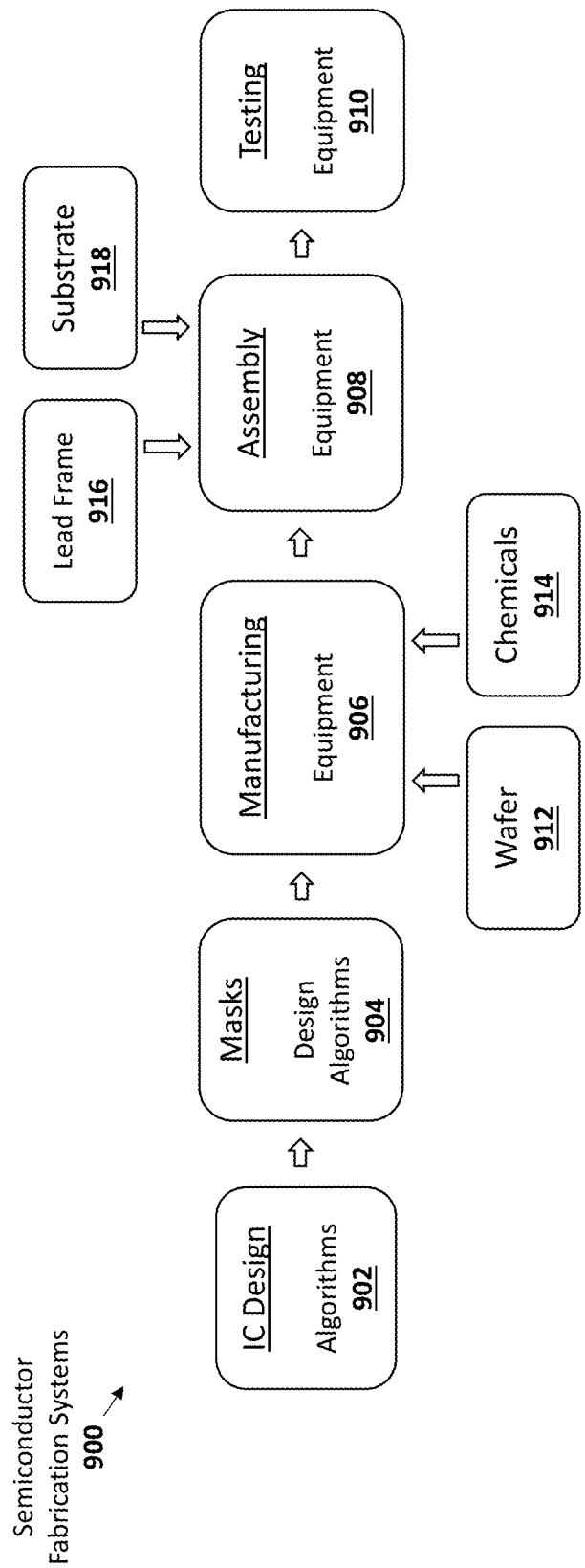
FIG. 9 depicts a block diagram illustrating a semiconductor fabrication system operable to incorporate aspects of the invention.

FIG. 9 depicts a block diagram illustrating semiconductor fabrication systems 900 that supports semiconductor fabrication processes capable of incorporating aspects of the invention. The semiconductor fabrication systems 900 includes IC design support algorithms 902, mask design support algorithms 904, manufacturing support equipment 906, assembly support equipment 908, and testing support equipment 910, configured and arranged as shown. The IC design support algorithms 902 are configured and arranged to provide computer-aided-design (CAD) assistance with the design of the logic circuits (AND, OR, and NOR gates) that form the various logic components of the IC. Similarly, the mask design support algorithms 904 are configured and arranged to provide CAD assistance with generating the mask design, which is the representation of an IC in terms of planar geometric shapes that correspond to the patterns of metal, oxide, or semiconductor layers that make up the components of the IC. The mask design places and connects all of the components that make up the IC such that they meet certain criteria, such as performance, size, density, and manufacturability. The manufacturing equipment 906 is the equipment used in executing the FEOL, MOL, BEOL, and Far-BEOL processes (including singulation processes) used to form the finished wafers and IC chips (or semiconductor die). In general, the wafer manufacturing equipment 906 comes in various forms, most of which specialize in growing, depositing or removing materials from a wafer. Examples of wafer manufacturing equipment 906 include oxidation systems, epitaxial reactors, diffusion systems, ion implantation equipment, physical vapor deposition systems, chemical vapor deposition systems, photolithography equipment, etching equipment, polishing equipment and the like. The various types of manufacturing equipment 902 take turns in depositing and removing (e.g., using the chemicals 914) different materials on and from the wafer 912 in specific patterns until a circuit is completely built on the wafer 912. The assembly equipment 908 is used to package the IC chips into finished IC packages that are physically ready for use in customer applications. The assembly equipment 908 can include wafer back-grind systems, wafer saw equipment, die attach machines, wire-bonders, die overcoat systems, molding equipment, hermetic sealing equipment, metal can welders, DTFS (de-flash, trim, form, and singulation) machines, branding equipment, and lead finish equipment. The major components used by the assembly equipment 908 include but are not limited to lead frames 916 and substrates 918. The test equipment 910 is used to test the IC packages so that only known good devices will be shipped to customers. Test Equipment 910 can include automatic test equipment (ATE); test handlers; tape and reel equipment; marking equipment; burn-in ovens; retention bake ovens; UV (ultraviolet) erase equipment, and vacuum sealers.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Figure 10:
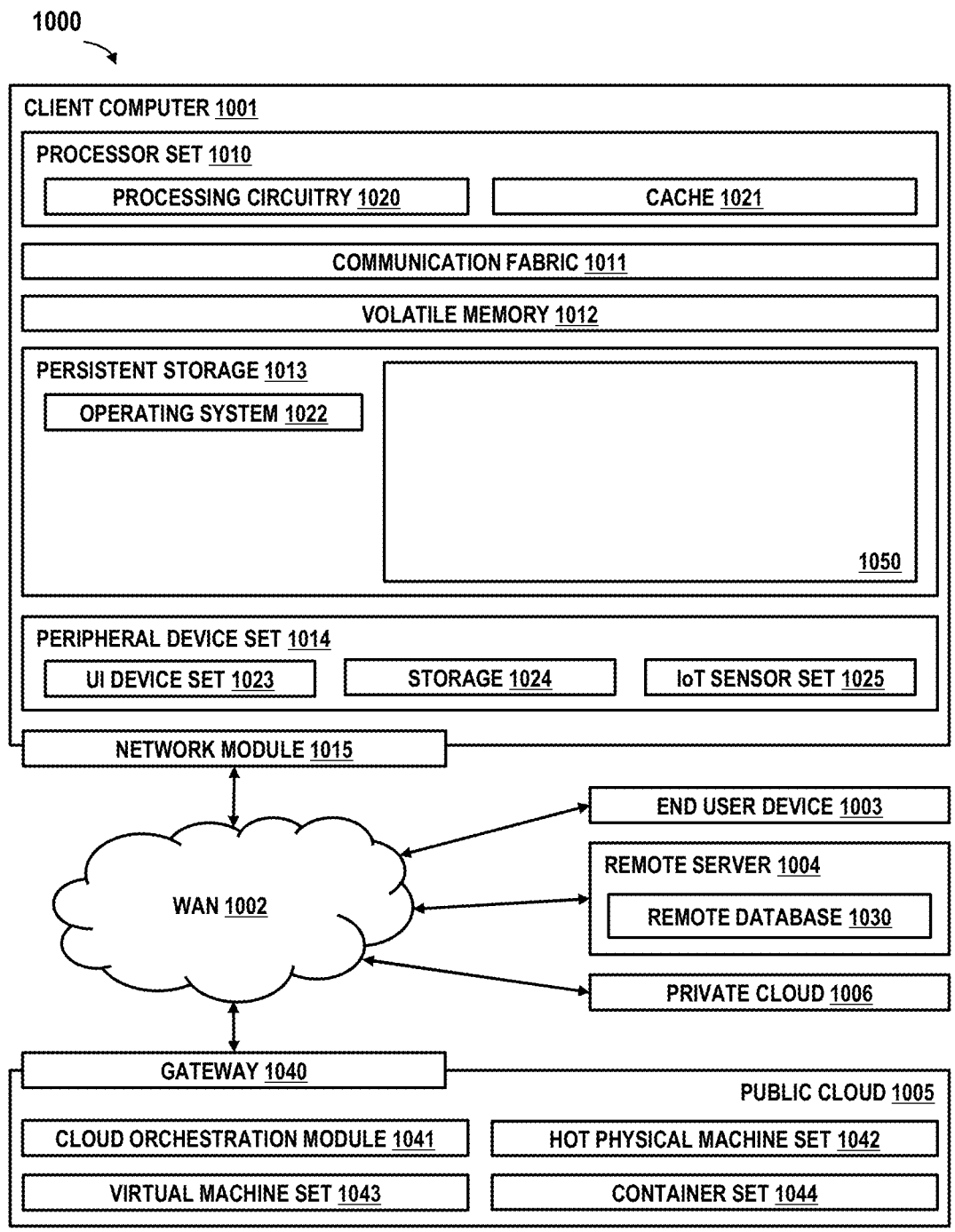
FIG. 10 depicts details of an exemplary computing environment operable to implement various aspects of the invention.

FIG. 10 depicts an example computing environment 1000 that can be used to implement aspects of the invention. Computing environment 1000 contains an example of an environment for the execution of at least some of the computer code involved in performing the inventive methods, such as the improved device design operations in a VR environment using a novel temporal collaboration dependency mapping model(s) 1050. In addition to block 1050, computing environment 1000 includes, for example, computer 1001, wide area network (WAN) 1002, end user device (EUD) 1003, remote server 1004, public cloud 1005, and private cloud 1006. In this embodiment, computer 1001 includes processor set 1010 (including processing circuitry 1020 and cache 1021), communication fabric 1011, volatile memory 1012, persistent storage 1013 (including operating system 1022 and block 1050, as identified above), peripheral device set 1014 (including user interface (UI) device set 1023, storage 1024, and Internet of Things (IoT) sensor set 1025), and network module 1015. Remote server 1004 includes remote database 1030. Public cloud 1005 includes gateway 1040, cloud orchestration module 1041, host physical machine set 1042, virtual machine set 1043, and container set 1044.

COMPUTER 1001 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1030. As is well understood in the art of computer technology, and depending upon the technology, performance of a computer-implemented method may be distributed among multiple computers and/or between multiple locations. On the other hand, in this presentation of computing environment 1000, detailed discussion is focused on a single computer, specifically computer 1001, to keep the presentation as simple as possible. Computer 1001 may be located in a cloud, even though it is not shown in a cloud in FIG. 10. On the other hand, computer 1001 is not required to be in a cloud except to any extent as may be affirmatively indicated.

PROCESSOR SET 1010 includes one, or more, computer processors of any type now known or to be developed in the future. Processing circuitry 1020 may be distributed over multiple packages, for example, multiple, coordinated integrated circuit chips. Processing circuitry 1020 may implement multiple processor threads and/or multiple processor cores. Cache 1021 is memory that is located in the processor chip package(s) and is typically used for data or code that should be available for rapid access by the threads or cores running on processor set 1010. Cache memories are typically organized into multiple levels depending upon relative proximity to the processing circuitry. Alternatively, some, or all, of the cache for the processor set may be located "off chip." In some computing environments, processor set 1010 may be designed for working with qubits and performing quantum computing.

Computer readable program instructions are typically loaded onto computer 1001 to cause a series of operational steps to be performed by processor set 1010 of computer 1001 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1021 and the other storage media discussed below. The program instructions, and associated data, are accessed by processor set 1010 to control and direct performance of the inventive methods. In computing environment 1000, at least some of the instructions for performing the inventive methods may be stored in block 1050 in persistent storage 1013.

COMMUNICATION FABRIC 1011 is the signal conduction path that allows the various components of computer 1001 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 1012 is any type of volatile memory now known or to be developed in the future. Examples include dynamic type random access memory (RAM) or static type RAM. Typically, volatile memory 1012 is characterized by random access, but this is not required unless affirmatively indicated. In computer 1001, the volatile memory 1012 is located in a single package and is internal to computer 1001, but, alternatively or additionally, the volatile memory may be distributed over multiple packages and/or located externally with respect to computer 1001.

PERSISTENT STORAGE 1013 is any form of non-volatile storage for computers that is now known or to be developed in the future. The non-volatility of this storage means that the stored data is maintained regardless of whether power is being supplied to computer 1001 and/or directly to persistent storage 1013. Persistent storage 1013 may be a read only memory (ROM), but typically at least a portion of the persistent storage allows writing of data, deletion of data and re-writing of data. Some familiar forms of persistent storage include magnetic disks and solid state storage devices. Operating system 1022 may take several forms, such as various known proprietary operating systems or open source Portable Operating System Interface-type operating systems that employ a kernel. The code included in block 1050 typically includes at least some of the computer code involved in performing the inventive methods.

PERIPHERAL DEVICE SET 1014 includes the set of peripheral devices of computer 1001. Data communication connections between the peripheral devices and the other components of computer 1001 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 1023 may include components such as a display screen, speaker, microphone, wearable devices (such as goggles and smart watches), keyboard, mouse, printer, touchpad, game controllers, and haptic devices. Storage 1024 is external storage, such as an external hard drive, or insertable storage, such as an SD card. Storage 1024 may be persistent and/or volatile. In some embodiments, storage 1024 may take the form of a quantum computing storage device for storing data in the form of qubits. In embodiments where computer 1001 is required to have a large amount of storage (for example, where computer 1001 locally stores and manages a large database) then this storage may be provided by peripheral storage devices designed for storing very large amounts of data, such as a storage area network (SAN) that is shared by multiple, geographically distributed computers. IoT sensor set 1025 is made up of sensors that can be used in Internet of Things applications. For example, one sensor may be a thermometer and another sensor may be a motion detector.

NETWORK MODULE 1015 is the collection of computer software, hardware, and firmware that allows computer 1001 to communicate with other computers through WAN 1002. Network module 1015 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1015 are performed on the same physical hardware device. In other embodiments (for example, embodiments that utilize software-defined networking (SDN)), the control functions and the forwarding functions of network module 1015 are performed on physically separate devices, such that the control functions manage several different network hardware devices. Computer readable program instructions for performing the inventive methods can typically be downloaded to computer 1001 from an external computer or external storage device through a network adapter card or network interface included in network module 1015.

WAN 1002 is any wide area network (for example, the internet) capable of communicating computer data over non-local distances by any technology for communicating computer data, now known or to be developed in the future. In some embodiments, the WAN 1002 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 1003 is any computer system that is used and controlled by an end user (for example, a customer of an enterprise that operates computer 1001), and may take any of the forms discussed above in connection with computer 1001. EUD 1003 typically receives helpful and useful data from the operations of computer 1001. For example, in a hypothetical case where computer 1001 is designed to provide a recommendation to an end user, this recommendation would typically be communicated from network module 1015 of computer 1001 through WAN 1002 to EUD 1003. In this way, EUD 1003 can display, or otherwise present, the recommendation to an end user. In some embodiments, EUD 1003 may be a client device, such as thin client, heavy client, mainframe computer, desktop computer and so on.

REMOTE SERVER 1004 is any computer system that serves at least some data and/or functionality to computer 1001. Remote server 1004 may be controlled and used by the same entity that operates computer 1001. Remote server 1004 represents the machine(s) that collect and store helpful and useful data for use by other computers, such as computer 1001. For example, in a hypothetical case where computer 1001 is designed and programmed to provide a recommendation based on historical data, then this historical data may be provided to computer 1001 from remote database 1030 of remote server 1004.

PUBLIC CLOUD 1005 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 1005 is performed by the computer hardware and/or software of cloud orchestration module 1041. The computing resources provided by public cloud 1005 are typically implemented by virtual computing environments that run on various computers making up the computers of host physical machine set 1042, which is the universe of physical computers in and/or available to public cloud 1005. The virtual computing environments (VCEs) typically take the form of virtual machines from virtual machine set 1043 and/or containers from container set 1044. It is understood that these VCEs may be stored as images and may be transferred among and between the various physical machine hosts, either as images or after instantiation of the VCE. Cloud orchestration module 1041 manages the transfer and storage of images, deploys new instantiations of VCEs and manages active instantiations of VCE deployments. Gateway 1040 is the collection of computer software, hardware, and firmware that allows public cloud 1005 to communicate through WAN 1002.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 1006 is similar to public cloud 1005, except that the computing resources are only available for use by a single enterprise. While private cloud 1006 is depicted as being in communication with WAN 1002, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1005 and private cloud 1006 are both part of a larger hybrid cloud.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" and variations thereof are used herein to mean "serving as an example, instance or illustration." Any embodiment or design described herein as "exemplary" is not necessarily to be construed as preferred or advantageous over other embodiments or designs. The terms "at least one," "one or more," and variations thereof, can include any integer number greater than or equal to one, i.e. one, two, three, four, etc. The terms "a plurality" and variations thereof can include any integer number greater than or equal to two, i.e., two, three, four, five, etc. The term "connection" and variations thereof can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrases "in signal communication", "in communication with," "communicatively coupled to," and variations thereof can be used interchangeably herein and can refer to any coupling, connection, or interaction using electrical signals to exchange information or data, using any system, hardware, software, protocol, or format, regardless of whether the exchange occurs wirelessly or over a wired connection.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

It will be understood that those skilled in the art, both now and in the future, may make various improvements and enhancements which fall within the scope of the claims which follow.

What is claimed is:

1. A computer-implemented method comprising:
accessing, using a processor system, a three-dimensional (3D) model of a device-under-design (DUD);
receiving, using the processor system, design operations comprising a first design operation configured to be applied to a first feature of the 3D model of the DUD;
accessing, using the processor system, a collaboration dependency model comprising relationships between:
the design operations; and
features of the DUD; and
using the collaboration dependency model to make a prediction of a dependency relationship between:
the first design operation configured to be applied to the first feature of the 3D model of the DUD; and
one or more aspects of the 3D model of the DUD.

2. The computer-implemented method of claim 1, wherein the one or more aspects comprise one or more DUD design parameters.

3. The computer-implemented method of claim 2 further comprising using the collaboration dependency model and a question and answer (Q&A) model to determine a conflict between the first design operation and the one or more DUD design parameters.

4. The computer-implemented method of claim 1 further comprising, based at least in part on the prediction of the dependency relationship, generating a dependency alert operable to notify a designer about the dependency relationship.

5. The computer-implemented method of claim 2 further comprising, based at least in part on the prediction of the dependency relationship, generating a recommendation associated with the dependency relationship between the first design operation and a second design operation associated with the one or more DUD design parameters.

6. The computer-implemented method of claim 2 further comprising, based at least in part on the prediction of the dependency relationship, generating a report associated with the dependency relationship between the first design operation and a second design operation associated with the one or more DUD design parameters.

7. The computer-implemented method of claim 1, wherein the one or more aspects comprise one or more dependent design operations.

8. A computer system comprising a processor communicatively coupled to a memory, wherein the processor performs processor operations comprising:
- accessing a three-dimensional (3D) model of a device-under-design (DUD);
- receiving design operations comprising a first design operation configured to be applied to a first feature of the 3D model of the DUD;
- accessing a collaboration dependency model comprising relationships between:
  - the design operations; and
  - features of the DUD; and
- using the collaboration dependency model to make a prediction of a dependency relationship between:
  - the first design operation configured to be applied to the first feature of the 3D model of the DUD; and
  - one or more aspects of the 3D model of the DUD.

9. The computer system of claim 8, wherein the one or more aspects comprise one or more DUD design parameters.

10. The computer system of claim 9, wherein the processor operations further comprise using the collaboration dependency model and a question and answer (Q&A) model to determine a conflict between the first design operation and the one or more DUD design parameters.

11. The computer system of claim 8, wherein the processor operations further comprise, based at least in part on the prediction of the dependency relationship, generating a dependency alert operable to notify a designer about the dependency relationship.

12. The computer system of claim 9, wherein the processor operations further comprise, based at least in part on the prediction of the dependency relationship, generating a recommendation associated with the dependency relationship between the first design operation and a second design operation associated with the one or more DUD design parameters.

13. The computer system of claim 9, wherein the processor operations further comprise, based at least in part on the prediction of the dependency relationship, generating a report associated with the dependency relationship between the first design operation and a second design operation associated with the one or more DUD design parameters.

14. The computer system of claim 8, wherein the one or more aspects comprise one or more dependent design operations.

15. A computer program product comprising a computer readable program stored on a computer readable storage medium, wherein the computer readable program, when executed on a processor system, causes the processor system to perform processor operations comprising:
- accessing a three-dimensional (3D) model of a device-under-design (DUD);
- receiving design operations comprising a first design operation configured to be applied to a first feature of the 3D model of the DUD;
- accessing a collaboration dependency model comprising relationships between:
  - the design operations; and
  - features of the DUD; and
- using the collaboration dependency model to make a prediction of a dependency relationship between:
  - the first design operation configured to be applied to the first feature of the 3D model of the DUD; and
  - one or more aspects of the 3D model of the DUD.

16. The computer program product of claim 15, wherein the one or more aspects comprise one or more DUD design parameters.

17. The computer program product of claim 16, wherein the processor operations further comprise using the collaboration dependency model and a question and answer (Q&A) model to determine a conflict between the first design operation and the one or more DUD design parameters.

18. The computer program product of claim 15, wherein the processor operations further comprise, based at least in part on the prediction of the dependency relationship, generating a dependency alert operable to notify a designer about of the dependency relationship.

19. The computer program product of claim 16, wherein the processor operations further comprise, based at least in part on the prediction of the dependency relationship, generating a recommendation associated with the dependency relationship between the first design operation and a second design operation associated with the one or more DUD design parameters.

20. The computer program product of claim 15, wherein the processor operations further comprise:
- based at least in part on the prediction of the dependency relationship, generating a report associated with the dependency relationship between the first design operation and a second design operation associated with the one or more aspects of the 3D model of the DUD; and
- applying the first design operation to the 3D model of the DUD in a virtual reality environment.

* * * * *